US009507275B2

(12) United States Patent
Lafarre et al.

(10) Patent No.: US 9,507,275 B2
(45) Date of Patent: Nov. 29, 2016

(54) SUPPORT APPARATUS, LITHOGRAPHIC APPARATUS AND DEVICE MANUFACTURING METHOD

(71) Applicant: ASML Netherlands B.V., Veldhoven (NL)

(72) Inventors: Raymond Wilhelmus Louis Lafarre, Helmond (NL); Adrianus Hendrik Koevoets, Mierlo (NL); Sjoerd Nicolaas Lambertus Donders, Vught (NL); Menno Fien, Tilburg (NL); Antonius Franciscus Johannes De Groot, Someren (NL); Christiaan Alexander Hoogendam, Westerhoven (NL); Johannes Henricus Wilhelmus Jacobs, Heeze (NL); Nicolaas Ten Kate, Almkerk (NL); Martijn Houben, 's-Hertogenbosch (NL); Jan Steven Christiaan Westerlaken, Heesch (NL); Jim Vincent Overkamp, Eindhoven (NL); Maarten Van Beijnum, Eindhoven (NL)

(73) Assignee: ASML NETHERLANDS B.V., Veldhoven (NL)

( * ) Notice: Subject to any disclaimer, the term of this patent is extended or adjusted under 35 U.S.C. 154(b) by 23 days.

(21) Appl. No.: 14/403,114

(22) PCT Filed: May 17, 2013

(86) PCT No.: PCT/EP2013/060218
§ 371 (c)(1),
(2) Date: Nov. 21, 2014

(87) PCT Pub. No.: WO2013/178484
PCT Pub. Date: Dec. 5, 2013

(65) Prior Publication Data
US 2015/0109599 A1 Apr. 23, 2015

Related U.S. Application Data

(60) Provisional application No. 61/666,348, filed on Jun. 29, 2012, provisional application No. 61/652,582, filed on May 29, 2012.

(51) Int. Cl.
G03B 27/58 (2006.01)
G03B 27/52 (2006.01)
G03F 7/20 (2006.01)

(52) U.S. Cl.
CPC .......... *G03F 7/70733* (2013.01); *G03F 7/707* (2013.01); *G03F 7/70341* (2013.01)

(58) Field of Classification Search
CPC ....................... G03F 7/70341; G03F 7/70775
USPC .............................. 355/30, 53, 72
See application file for complete search history.

(56) References Cited

U.S. PATENT DOCUMENTS

| 4,509,852 A | 4/1985 | Tabarelli et al. |
| 7,199,858 B2 * | 4/2007 | Lof ..................... G03F 7/70341 355/30 |

(Continued)

FOREIGN PATENT DOCUMENTS

| CN | 1786832 | 6/2006 |
| CN | 1894773 | 1/2007 |

(Continued)

OTHER PUBLICATIONS

International Search Report mailed Jul. 31, 2013 in corresponding International Patent Application No. PCT/EP2013/060218.

(Continued)

*Primary Examiner* — Hung Henry Nguyen
(74) *Attorney, Agent, or Firm* — Pillsbury Winthrop Shaw Pittman LLP

(57) ABSTRACT

A support apparatus for a lithographic apparatus has an object holder and an extraction body radially outward of the object holder. The object holder is configured to support an object. The extraction body includes an extraction opening configured to extract fluid from a top surface of the support apparatus. The extraction body is spaced from the object holder such that the extraction body is substantially decoupled from the object holder. The extraction body comprises a projection configured such that it surrounds the object holder and such that, in use, a layer of liquid is retained on the projection and in contact with an object supported on the object holder.

20 Claims, 15 Drawing Sheets

(56) References Cited

U.S. PATENT DOCUMENTS

| | | | |
|---|---|---|---|
| 7,213,963 B2 | 5/2007 | Lof et al. | |
| 7,365,827 B2 | 4/2008 | Hennus et al. | |
| 7,593,092 B2 | 9/2009 | Lof et al. | |
| 7,593,093 B2 | 9/2009 | Lof et al. | |
| 7,649,611 B2 | 1/2010 | Zaal et al. | |
| 7,652,746 B2 | 1/2010 | Jacobs et al. | |
| 7,751,027 B2 | 7/2010 | Jacobs et al. | |
| 7,791,709 B2 | 9/2010 | Hennus et al. | |
| 7,982,857 B2 * | 7/2011 | Nishii | G03F 7/70341 355/72 |
| 8,027,019 B2 | 9/2011 | Kemper et al. | |
| 8,154,708 B2 | 4/2012 | Lof et al. | |
| 8,269,949 B2 | 9/2012 | Vermeulen et al. | |
| 8,472,002 B2 | 6/2013 | Lof et al. | |
| 8,482,845 B2 | 7/2013 | Lof et al. | |
| 8,558,989 B2 | 10/2013 | Lof et al. | |
| 8,564,763 B2 | 10/2013 | Jacobs et al. | |
| 8,610,089 B2 | 12/2013 | Donders et al. | |
| 8,634,052 B2 | 1/2014 | Auer-Jongepier et al. | |
| 8,743,339 B2 | 6/2014 | Zaal et al. | |
| 8,823,919 B2 | 9/2014 | Dziomkina et al. | |
| 9,059,228 B2 | 6/2015 | Stavenga et al. | |
| 2004/0207824 A1 | 10/2004 | Lof et al. | |
| 2005/0264778 A1 | 12/2005 | Lof et al. | |
| 2006/0038968 A1 | 2/2006 | Kemper et al. | |
| 2006/0119817 A1 | 6/2006 | Hennus et al. | |
| 2006/0158627 A1 | 7/2006 | Kemper et al. | |
| 2006/0285093 A1 | 12/2006 | Hara et al. | |
| 2007/0109521 A1 | 5/2007 | Nishii et al. | |
| 2007/0114452 A1 | 5/2007 | Jansen et al. | |
| 2007/0153244 A1 * | 7/2007 | Maria Zaal | G03F 7/70341 355/30 |
| 2007/0229786 A1 | 10/2007 | Kemper et al. | |
| 2007/0229787 A1 | 10/2007 | Emoto | |
| 2008/0158526 A1 | 7/2008 | Hennus et al. | |
| 2008/0212046 A1 | 9/2008 | Riepen et al. | |
| 2008/0316411 A1 | 12/2008 | Choo et al. | |
| 2009/0040481 A1 | 2/2009 | Nishikawara | |
| 2009/0279060 A1 | 11/2009 | Direcks et al. | |
| 2009/0279061 A1 | 11/2009 | Jacobs et al. | |
| 2009/0279062 A1 | 11/2009 | Direcks et al. | |
| 2009/0290135 A1 | 11/2009 | Lof et al. | |
| 2009/0296068 A1 | 12/2009 | Castelijns et al. | |
| 2010/0245791 A1 | 9/2010 | Jacobs et al. | |
| 2010/0277709 A1 | 11/2010 | Stavenga et al. | |
| 2010/0313974 A1 | 12/2010 | Riepen et al. | |
| 2011/0181849 A1 | 7/2011 | Patel et al. | |
| 2011/0222035 A1 | 9/2011 | Zaal et al. | |
| 2011/0222036 A1 | 9/2011 | Zaal et al. | |
| 2011/0279800 A1 | 11/2011 | Lof et al. | |
| 2011/0285977 A1 | 11/2011 | Lof et al. | |
| 2012/0013865 A1 | 1/2012 | Laurent et al. | |
| 2012/0120376 A1 | 5/2012 | Bessems et al. | |
| 2012/0274911 A1 | 11/2012 | Lof et al. | |
| 2013/0045447 A1 | 2/2013 | Kunnen et al. | |
| 2013/0094005 A1 | 4/2013 | Kunnen et al. | |
| 2013/0250270 A1 | 9/2013 | Lof et al. | |

FOREIGN PATENT DOCUMENTS

| | | |
|---|---|---|
| CN | 101833248 | 9/2010 |
| CN | 101598907 | 11/2011 |
| EP | 1 420 298 | 5/2004 |
| EP | 1 429 188 | 6/2004 |
| JP | 2006-054427 | 2/2006 |
| JP | 2007-266603 | 10/2007 |
| JP | 2009-43879 | 2/2009 |
| JP | 2009-295978 | 12/2009 |
| JP | 2010-034227 | 2/2010 |
| JP | 2010-212713 | 9/2010 |
| JP | 2012-23371 | 2/2012 |
| KR | 10-2007-0098527 | 10/2007 |
| KR | 10-2007-0107935 | 11/2007 |
| TW | 201142547 | 12/2011 |
| WO | 99/49504 | 9/1999 |
| WO | 2013/171013 | 11/2013 |

OTHER PUBLICATIONS

Taiwan Office Action dated Jul. 21, 2016 in corresponding Taiwan Patent Application No. 102118695.

* cited by examiner

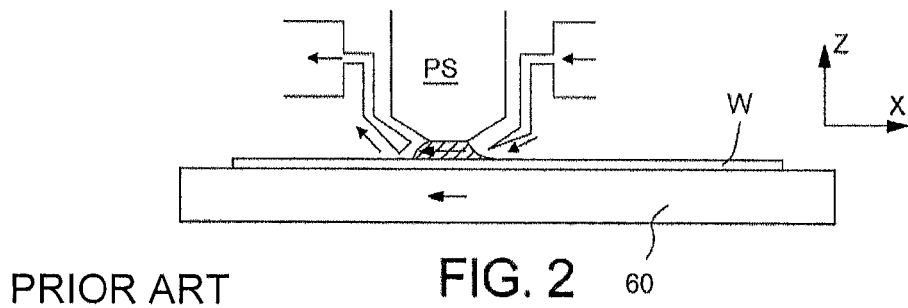
PRIOR ART  FIG. 2
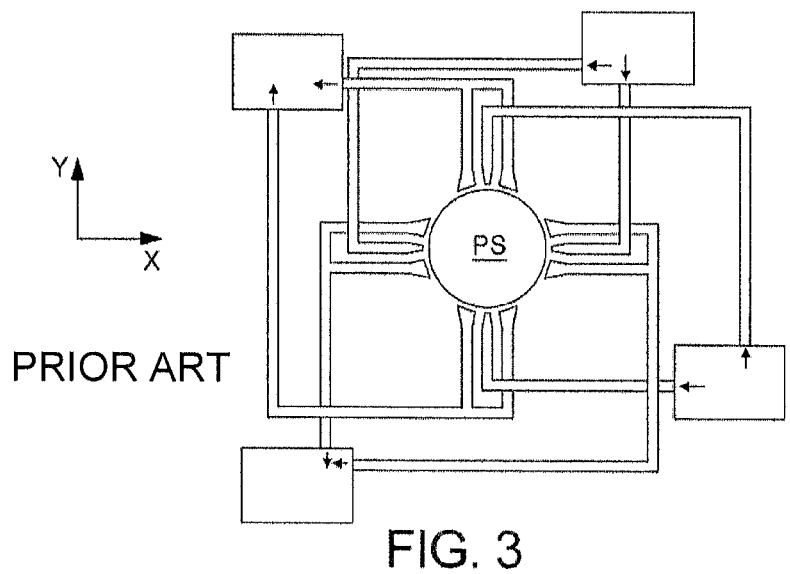
PRIOR ART
FIG. 3
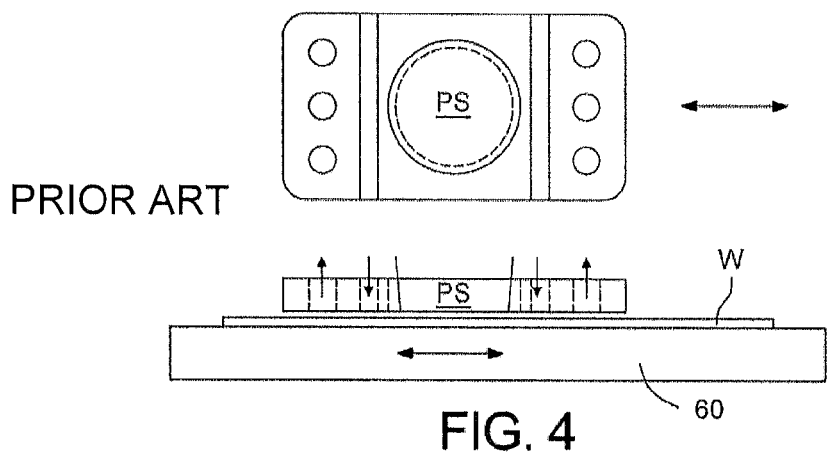
PRIOR ART
FIG. 4

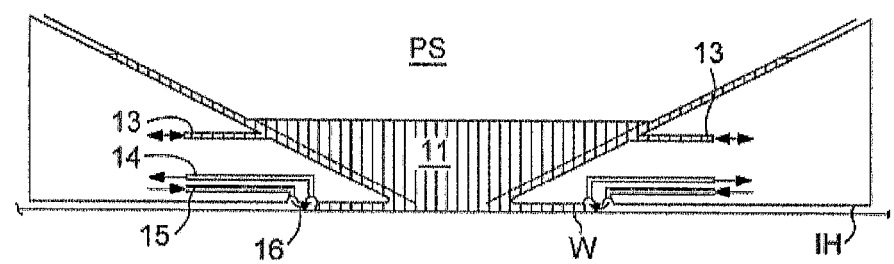
PRIOR ART  FIG. 5
FIG. 6
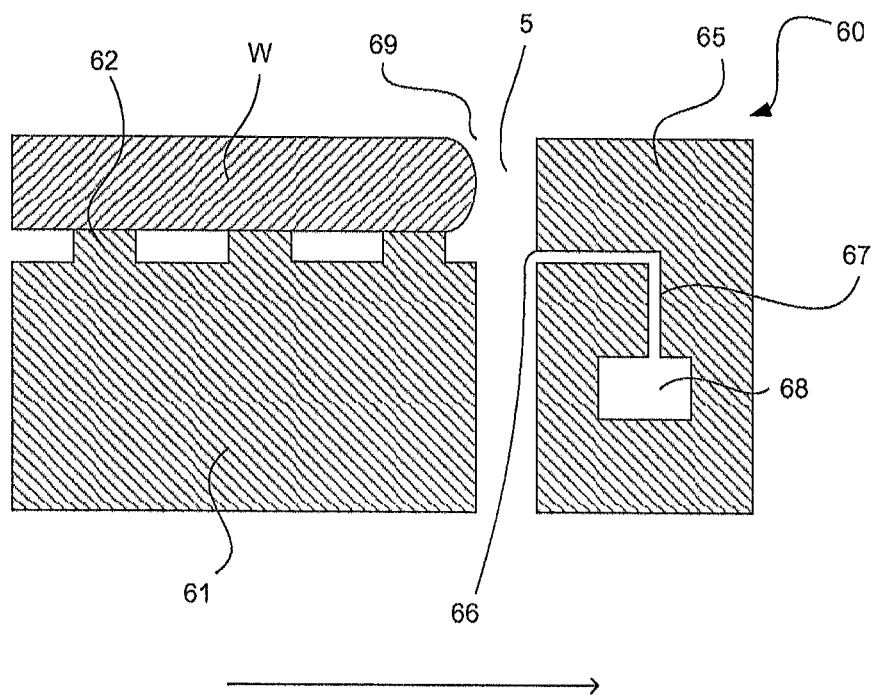

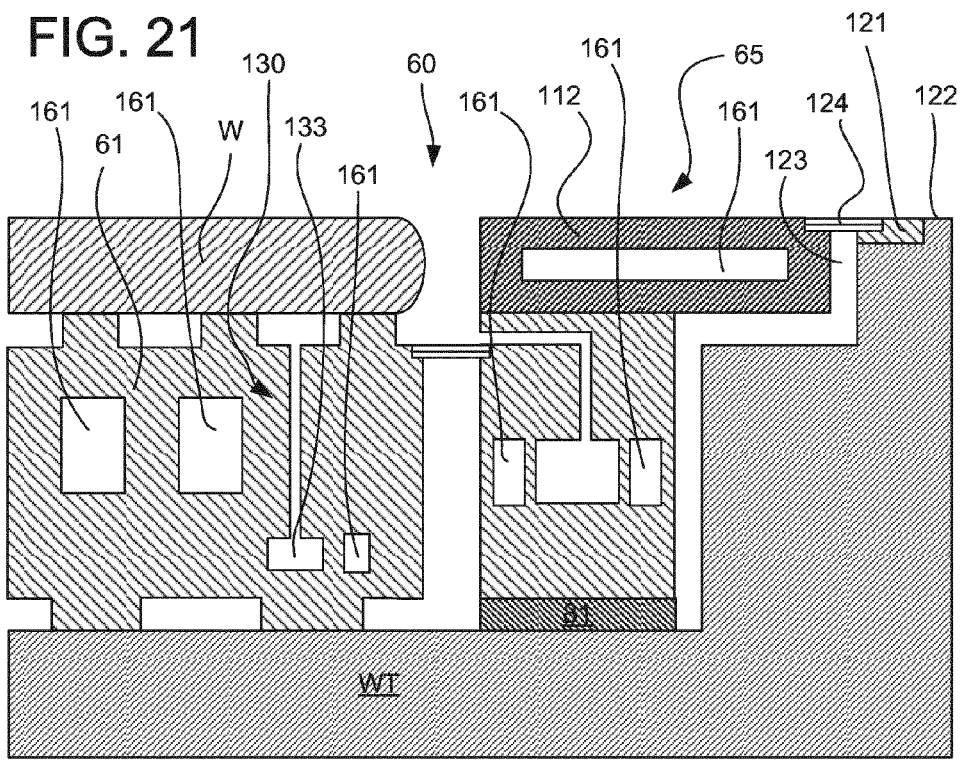
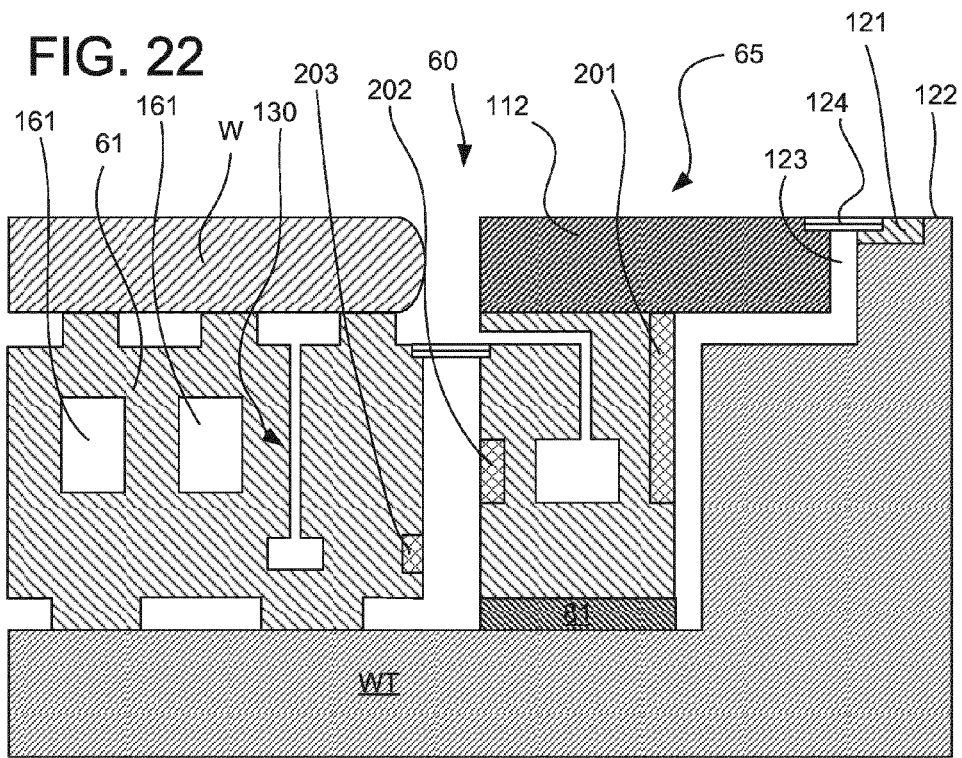

SUPPORT APPARATUS, LITHOGRAPHIC APPARATUS AND DEVICE MANUFACTURING METHOD

CROSS-REFERENCE TO RELATED APPLICATIONS

This application is the U.S. national phase entry of PCT patent application no. PCT/EP2013/060218, which was filed on May 17, 2013, which claims the benefit of priority of U.S. provisional application No. 61/652,582, which was filed on May 29, 2012, and U.S. provisional application No. 61/666,348, which was filed on Jun. 29, 2012, each of which applications are incorporated herein in its entirety by reference.

FIELD

The present invention relates to a support apparatus, a lithographic apparatus and a device manufacturing method.

BACKGROUND

A lithographic apparatus is a machine that applies a desired pattern onto a substrate, usually onto a target portion of the substrate. A lithographic apparatus can be used, for example, in the manufacture of integrated circuits (ICs). In that instance, a patterning device, which is alternatively referred to as a mask or a reticle, may be used to generate a circuit pattern to be formed on an individual layer of the IC. This pattern can be transferred onto a target portion (e.g. comprising part of, one, or several dies) on a substrate (e.g. a silicon wafer). Transfer of the pattern is typically via imaging onto a layer of radiation-sensitive material (resist) provided on the substrate. In general, a single substrate will contain a network of adjacent target portions that are successively patterned. Known lithographic apparatus include so-called steppers, in which each target portion is irradiated by exposing an entire pattern onto the target portion at one time, and so-called scanners, in which each target portion is irradiated by scanning the pattern through a radiation beam in a given direction (the "scanning"-direction) while synchronously scanning the substrate parallel or anti-parallel to this direction. It is also possible to transfer the pattern from the patterning device to the substrate by imprinting the pattern onto the substrate.

It has been proposed to immerse the substrate in the lithographic projection apparatus in a liquid having a relatively high refractive index, e.g. water, so as to fill a space between the final element of the projection system and the substrate. In an embodiment, the liquid is distilled water, although another liquid can be used. An embodiment of the invention will be described with reference to liquid. However, another fluid may be suitable, particularly a wetting fluid, an incompressible fluid and/or a fluid with higher refractive index than air, desirably a higher refractive index than water. Fluids excluding gases are particularly desirable. The point of this is to enable imaging of smaller features since the exposure radiation will have a shorter wavelength in the liquid. (The effect of the liquid may also be regarded as increasing the effective numerical aperture (NA) of the system and also increasing the depth of focus.) Other immersion liquids have been proposed, including water with solid particles (e.g. quartz) suspended therein, or a liquid with a nano-particle suspension (e.g. particles with a maximum dimension of up to 10 nm). The suspended particles may or may not have a similar or the same refractive index as the liquid in which they are suspended. Other liquids which may be suitable include a hydrocarbon, such as an aromatic, a fluorohydrocarbon, and/or an aqueous solution.

Submersing the substrate or substrate and substrate table in a bath of liquid (see, for example, U.S. Pat. No. 4,509,852) means that there is a large body of liquid that must be accelerated during a scanning exposure. This requires additional or more powerful motors and turbulence in the liquid may lead to undesirable and unpredictable effects.

In an immersion apparatus, immersion fluid is handled by a fluid handling system, device structure or apparatus. In an embodiment the fluid handling system may supply immersion fluid and therefore be a fluid supply system. In an embodiment the fluid handling system may at least partly confine immersion fluid and thereby be a fluid confinement system. In an embodiment the fluid handling system may provide a barrier to immersion fluid and thereby be a barrier member, such as a fluid confinement structure. In an embodiment the fluid handling system may create or use a flow of gas, for example to help in controlling the flow and/or the position of the immersion fluid. The flow of gas may form a seal to confine the immersion fluid so the fluid handling structure may be referred to as a seal member; such a seal member may be a fluid confinement structure. In an embodiment, immersion liquid is used as the immersion fluid. In that case the fluid handling system may be a liquid handling system. In reference to the aforementioned description, reference in this paragraph to a feature defined with respect to fluid may be understood to include a feature defined with respect to liquid.

Handling immersion liquid in a lithographic apparatus brings with it one or more problems of liquid handling. A gap normally exists between an object, such as a substrate and/or a sensor, and a table (e.g. a substrate table or a measurement table) around the edge of the object (e.g., substrate and/or sensor). U.S. patent application publication US 2005-0264778 discloses filling that gap with material or providing a liquid source or low pressure source to deliberately fill the gap with liquid in order to avoid bubble inclusion as the gap passes under the liquid supply system and/or to remove any liquid which does enter the gap.

SUMMARY

It is desirable, for example, to improve the stability of the temperature profile of an object holder of a lithographic apparatus.

According to an aspect, there is provided a support apparatus for a lithographic apparatus, comprising: an object holder configured to support an object; and an extraction body radially outward of the object holder, the extraction body comprising an extraction opening configured to extract fluid from a top surface of the support apparatus, wherein the extraction body is spaced from the object holder such that the extraction body is substantially decoupled from the object holder; wherein the extraction body comprises a projection configured such that it surrounds the object holder and such that, in use, a layer of liquid is retained on the projection and in contact with an object supported on the object holder.

According to an aspect, there is provided a support apparatus for a lithographic apparatus, comprising: an object holder; and an extraction body radially outward of the object holder, the extraction body comprising an extraction opening configured to extract fluid from a top surface of the support apparatus, wherein the extraction body is connected to the object holder by a plurality of peripherally spaced joints such that, between the joints, the extraction body is spaced from the object holder.

According to an aspect, there is provided a device manufacturing method using a lithographic apparatus, the method comprising: projecting a beam patterned by a patterning device onto a substrate while supporting the substrate with a support apparatus, wherein the support apparatus comprises: an object holder configured to support an object; and an extraction body radially outward of the object holder, the extraction body comprising an extraction opening configured to extract fluid from a top surface of the support apparatus, wherein the extraction body is spaced from the object holder such that the extraction body is substantially decoupled from the object holder; wherein the extraction body comprises a projection configured such that it surrounds the object holder and such that, in use, a layer of liquid is retained on the projection and in contact with an object supported on the object holder.

According to an aspect, there is provided a device manufacturing method using a lithographic apparatus, the method comprising: projecting a beam patterned by a patterning device onto a substrate while supporting the substrate with a support apparatus, wherein the support apparatus comprises: an object holder; and an extraction body radially outward of the object holder, the extraction body comprising an extraction opening configured to extract fluid from a top surface of the support apparatus, wherein the extraction body is connected to the object holder by a plurality of peripherally spaced joints such that, between the joints, the extraction body is spaced from the object holder.

According to an aspect, there is provided a support apparatus comprising: a table formed of a table material having a thermal conductivity; a body positioned within a recess of the table, wherein there is a gap between the body and the table; and a member bridging the gap from a top surface of the body to a top surface of the table, the member comprising a thermal resistance layer of thermal resistance material having a lower thermal conductivity than the thermal conductivity of the table material.

According to an aspect, there is provided a device manufacturing method using a lithographic apparatus, the method comprising: projecting a beam patterned by a patterning device onto a substrate while supporting the substrate with a support apparatus, wherein the support apparatus comprises: a table formed of a table material having a thermal conductivity; a body positioned within a recess of the table, wherein there is a gap between the body and the table; and a member bridging the gap from a top surface of the body to a top surface of the table, the member comprising a thermal resistance layer of thermal resistance material having a lower thermal conductivity than the thermal conductivity of the table material.

BRIEF DESCRIPTION OF THE DRAWINGS

Embodiments of the invention will now be described, by way of example only, with reference to the accompanying schematic drawings in which corresponding reference symbols indicate corresponding parts, and in which:

FIGS. 2 and 3 depict a liquid supply system for use in a lithographic projection apparatus;

FIG. 4 depicts a further liquid supply system for use in a lithographic projection apparatus;

FIG. 5 depicts a further liquid supply system for use in a lithographic projection apparatus;

FIGS. 6-8 depict, in cross-section, a part of a support apparatus of an embodiment;

FIGS. 20-30 depict, in cross-section, a part of a support apparatus of an embodiment.

DETAILED DESCRIPTION

Figure 1:
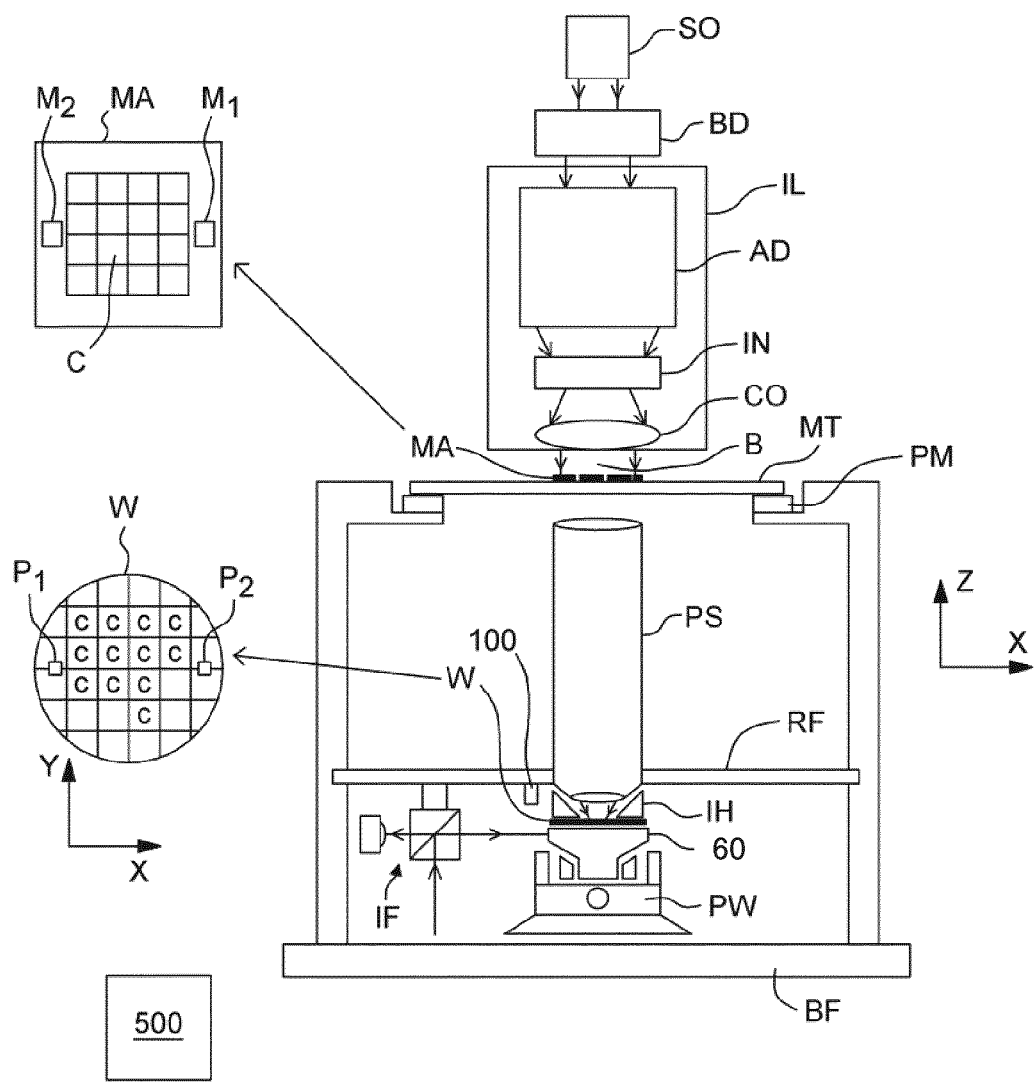
FIG. 1 depicts a lithographic apparatus according to an embodiment of the invention.

FIG. 1 schematically depicts a lithographic apparatus according to one embodiment of the invention. The apparatus comprises:
   an illumination system (illuminator) IL configured to condition a radiation beam B (e.g. UV radiation or DUV radiation);
   a support structure (e.g. a mask table) MT constructed to support a patterning device (e.g. a mask) MA and connected to a first positioner PM configured to accurately position the patterning device MA in accordance with certain parameters;
   a support table, e.g. a sensor table to support one or more sensors or a substrate support apparatus 60 constructed to hold a substrate (e.g. a resist-coated substrate) W, connected to a second positioner PW configured to accurately position the surface of the table, for example of a substrate W, in accordance with certain parameters; and
   a projection system (e.g. a refractive projection lens system) PS configured to project a pattern imparted to the radiation beam B by patterning device MA onto a target portion C (e.g. comprising part of, one, or more dies) of the substrate W.

The illumination system IL may include various types of optical components, such as refractive, reflective, magnetic, electromagnetic, electrostatic or other types of optical components, or any combination thereof, for directing, shaping, or controlling radiation.

The support structure MT holds the patterning device MA. It holds the patterning device MA in a manner that depends on the orientation of the patterning device MA, the design of the lithographic apparatus, and other conditions, such as for example whether or not the patterning device MA is held in a vacuum environment. The support structure MT can use mechanical, vacuum, electrostatic or other clamping techniques to hold the patterning device MA. The support structure MT may be a frame or a table, for example, which may be fixed or movable as required. The support structure MT may ensure that the patterning device MA is at a desired position, for example with respect to the projection system PS. Any use of the terms "reticle" or "mask" herein may be considered synonymous with the more general term "patterning device."

The term "patterning device" used herein should be broadly interpreted as referring to any device that can be used to impart a radiation beam with a pattern in its cross-section such as to create a pattern in a target portion of the substrate. It should be noted that the pattern imparted to the radiation beam may not exactly correspond to the desired pattern in the target portion of the substrate, for example if the pattern includes phase-shifting features or so called assist features. Generally, the pattern imparted to the radiation beam will correspond to a particular functional layer in a device being created in the target portion, such as an integrated circuit.

The patterning device MA may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable minor array employs a matrix arrangement of small mirrors, each of which can be individually tilted so as to reflect an incoming radiation beam in different directions. The tilted minors impart a pattern in a radiation beam which is reflected by the minor matrix.

The term "projection system" used herein should be broadly interpreted as encompassing any type of projection system, including refractive, reflective, catadioptric, magnetic, electromagnetic and electrostatic optical systems, or any combination thereof, as appropriate for the exposure radiation being used, or for other factors such as the use of an immersion liquid or the use of a vacuum. Any use of the term "projection lens" herein may be considered as synonymous with the more general term "projection system".

As here depicted, the apparatus is of a transmissive type (e.g. employing a transmissive mask). Alternatively, the apparatus may be of a reflective type (e.g. employing a programmable minor array of a type as referred to above, or employing a reflective mask).

The lithographic apparatus may be of a type having two or more tables (or stage(s) or support(s)), e.g., two or more substrate tables or a combination of one or more substrate tables and one or more sensor or measurement tables. In such "multiple stage" machines the multiple tables may be used in parallel, or preparatory steps may be carried out on one or more tables while one or more other tables are being used for exposure. The lithographic apparatus may have two or more patterning device tables (or stage(s) or support(s)) which may be used in parallel in a similar manner to substrate, sensor and measurement tables.

Referring to FIG. 1, the illuminator IL receives a radiation beam from a radiation source SO. The source SO and the lithographic apparatus may be separate entities, for example when the source SO is an excimer laser. In such cases, the source SO is not considered to form part of the lithographic apparatus and the radiation beam is passed from the source SO to the illuminator IL with the aid of a beam delivery system BD comprising, for example, suitable directing mirrors and/or a beam expander. In other cases the source SO may be an integral part of the lithographic apparatus, for example when the source SO is a mercury lamp. The source SO and the illuminator IL, together with the beam delivery system BD if required, may be referred to as a radiation system.

The illuminator IL may comprise an adjuster AD for adjusting the angular intensity distribution of the radiation beam. Generally, at least the outer and/or inner radial extent (commonly referred to as σ-outer and σ-inner, respectively) of the intensity distribution in a pupil plane of the illuminator IL can be adjusted. In addition, the illuminator IL may comprise various other components, such as an integrator IN and a condenser CO. The illuminator IL may be used to condition the radiation beam to have a desired uniformity and intensity distribution in its cross-section. Similar to the source SO, the illuminator IL may or may not be considered to form part of the lithographic apparatus. For example, the illuminator IL may be an integral part of the lithographic apparatus or may be a separate entity from the lithographic apparatus. In the latter case, the lithographic apparatus may be configured to allow the illuminator IL to be mounted thereon. Optionally, the illuminator IL is detachable and may be separately provided (for example, by the lithographic apparatus manufacturer or another supplier).

The radiation beam B is incident on the patterning device (e.g., mask) MA, which is held on the support structure (e.g., mask table) MT, and is patterned by the patterning device MA. Having traversed the patterning device MA, the radiation beam B passes through the projection system PS, which focuses the beam onto a target portion C of the substrate W. With the aid of the second positioner PW and position sensor IF (e.g. an interferometric device, linear encoder or capacitive sensor), the substrate support apparatus 60 can be moved accurately, e.g. so as to position different target portions C in the path of the radiation beam B. Similarly, the first positioner PM and another position sensor (which is not explicitly depicted in FIG. 1) can be used to accurately position the patterning device MA with respect to the path of the radiation beam B, e.g. after mechanical retrieval from a mask library, or during a scan. In general, movement of the support structure MT may be realized with the aid of a long-stroke module (coarse positioning) and a short-stroke module (fine positioning), which form part of the first positioner PM. Similarly, movement of the substrate support apparatus 60 may be realized using a long-stroke module and a short-stroke module, which form part of the second positioner PW. In the case of a stepper (as opposed to a scanner) the support structure MT may be connected to a short-stroke actuator only, or may be fixed. Patterning device MA and substrate W may be aligned using patterning device alignment marks M1, M2 and substrate alignment marks P1, P2. Although the substrate alignment marks as illustrated occupy dedicated target portions, they may be located in spaces between target portions C (these are known as scribe-lane alignment marks). Similarly, in situations in which more than one die is provided on the patterning device MA, the patterning device alignment marks may be located between the dies.

The depicted apparatus could be used in at least one of the following modes:

1. In step mode, the support structure MT and the substrate support apparatus 60 are kept essentially stationary, while an entire pattern imparted to the radiation beam B is projected onto a target portion C at one time (i.e. a single static exposure). The substrate support apparatus 60 is then shifted in the X and/or Y direction so that a different target portion C can be exposed. In step mode, the maximum size of the exposure field limits the size of the target portion C imaged in a single static exposure.

2. In scan mode, the support structure MT and the substrate support apparatus 60 are scanned synchronously while a pattern imparted to the radiation beam B is projected onto a target portion C (i.e. a single dynamic exposure). The velocity and direction of the substrate support apparatus 60 relative to the support structure MT may be determined by the (de-)magnification and image reversal characteristics of the projection system PS. In scan mode, the maximum size of the exposure field limits the width (in the non-scanning direction) of the target portion C in a single dynamic exposure, whereas the length of the scanning motion (and size of the exposure field) determines the height (in the scanning direction) of the target portion C.

3. In another mode, the support structure MT is kept essentially stationary holding a programmable patterning device, and the substrate support apparatus 60 is moved or scanned while a pattern imparted to the radiation beam is projected onto a target portion C. In this mode, generally a pulsed radiation source is employed and the programmable patterning device is updated as required after each movement of the substrate support apparatus 60 or in between successive radiation pulses during a scan. This mode of operation can be readily applied to maskless lithography that utilizes a programmable patterning device, such as a programmable minor array of a type as referred to above.

Combinations and/or variations on the above described modes of use or entirely different modes of use may also be employed.

Arrangements for providing liquid between a final element of the projection system PS and the substrate can be classed into three general categories. These are the bath type arrangement, the so-called localized immersion system and the all-wet immersion system. In a bath type arrangement substantially the whole of the substrate W and optionally part of the substrate support apparatus 60 is submersed in a bath of liquid.

A localized immersion system uses a liquid supply system in which liquid is only provided to a localized area of the substrate. The space filled by liquid is smaller in plan than the top surface of the substrate and the volume filled with liquid remains substantially stationary relative to the projection system PS while the substrate W moves underneath that volume. FIGS. 2-5 show different supply devices which can be used in such a system. A sealing feature is present to seal liquid to the localized area. One way which has been proposed to arrange for this is disclosed in PCT patent application publication no. WO 99/49504.

In an all wet arrangement the liquid is unconfined. The whole top surface of the substrate and all or part of the substrate table is covered in immersion liquid. The depth of the liquid covering at least the substrate is small. The liquid may be a film, such as a thin film, of liquid on the substrate. Immersion liquid may be supplied to or in the region of a projection system and a facing surface facing the projection system (such a facing surface may be the surface of a substrate and/or a substrate table). Any of the liquid supply devices of FIGS. 2-5 can also be used in such a system. However, a sealing feature is not present, not activated, not as efficient as normal or otherwise ineffective to seal liquid to only the localized area.

As illustrated in FIGS. 2 and 3, liquid is supplied by at least one inlet onto the substrate, preferably along the direction of movement of the substrate relative to the final element. Liquid is removed by at least one outlet after having passed under the projection system. As the substrate is scanned beneath the element in a −X direction, liquid is supplied at the +X side of the element and taken up at the −X side. Various orientations and numbers of in- and outlets positioned around the final element are possible; one example is illustrated in FIG. 3 in which four sets of an inlet with an outlet on either side are provided in a regular pattern around the final element. Note that the direction of flow of the liquid is shown by arrows in FIGS. 2 and 3.

A further immersion lithography solution with a localized liquid supply system is shown in FIG. 4. Liquid is supplied by two groove inlets on either side of the projection system PS and is removed by a plurality of discrete outlets arranged radially outwardly of the inlets. Note that the direction of flow of fluid and of the substrate is shown by arrows in FIG. 4.

Another arrangement which has been proposed is to provide the liquid supply system with a liquid confinement structure which extends along at least a part of a boundary of the space between the final element of the projection system and the substrate, substrate table or both. Such an arrangement is illustrated in FIG. 5.

FIG. 5 schematically depicts a localized liquid supply system or fluid handling system with a liquid confinement structure IH, which extends along at least a part of a boundary of the space between the final element of the projection system and the substrate support apparatus 60 or substrate W. (Please note that reference in the following text to surface of the substrate W also refers in addition or in the alternative to a surface of the substrate table, unless expressly stated otherwise.) In an embodiment, a seal is formed between the liquid confinement structure IH and the surface of the substrate W and which may be a contactless seal such as a gas seal (such a system with a gas seal is disclosed in European patent application publication no. EP-A-1,420,298) or a liquid seal.

The liquid confinement structure IH at least partly contains liquid in the space 11 between a final element of the projection system PS and the substrate W. The space 11 is at least partly formed by the liquid confinement structure IH positioned below and surrounding the final element of the projection system PS. Liquid is brought into the space below the projection system PS and within the liquid confinement structure IH by liquid inlet 13. The liquid may be removed by liquid outlet 13.

The liquid may be contained in the space 11 by a gas seal 16 which, during use, is formed between the bottom of the barrier member IH and the surface of the substrate W. The gas in the gas seal is provided under pressure via inlet 15 to the gap between barrier member IH and substrate W. The gas is extracted via outlet 14. The overpressure on the gas inlet 15, vacuum level on the outlet 14 and geometry of the gap are arranged so that there is a high-velocity gas flow 16 inwardly that confines the liquid. The force of the gas on the liquid between the barrier member IH and the substrate W contains the liquid in a space 11. Such a system is disclosed in United States patent application publication no. US 2004-0207824, which is hereby incorporated by reference in its entirety. In an embodiment, the liquid confinement structure IH does not have a gas seal.

An embodiment of the present invention may be applied to any fluid handling structure including those disclosed, for example, in United States patent application publication nos. US 2006-0158627, US 2006-0038968, US 2008-0212046, US 2009-0279060, US 2009-0279062, US 2004-0207824, US 2010-0313974 and US 2012-0120376, the contents of all of which are hereby incorporated in their entirety by reference.

A controller 500 controls the overall operations of the lithographic apparatus and in particular performs an operation process described further below. Controller 500 can be embodied as a suitably-programmed general purpose computer comprising a central processing unit, volatile and non-volatile storage means, one or more input and output devices such as a keyboard and screen, one or more network connections and one or more interfaces to the various parts of the lithographic apparatus. It will be appreciated that a one-to-one relationship between controlling computer and lithographic apparatus is not necessary. In an embodiment of the invention one computer can control multiple lithographic apparatuses. In an embodiment of the invention, multiple networked computers can be used to control one lithographic apparatus. The controller 500 may also be configured to control one or more associated process devices and substrate handling devices in a lithocell or cluster of which the lithographic apparatus forms a part. The controller 500 can also be configured to be subordinate to a supervisory control system of a lithocell or cluster and/or an overall control system of a fab. In an embodiment the controller operates the apparatus to perform an embodiment of the present invention. In an embodiment the controller 500 has a memory to store the results of a step one described herein for later use in a step two.

FIG. 6 depicts an embodiment of the present invention. FIG. 6 is a cross-section through a support apparatus and an object. In an embodiment the support apparatus is a substrate support apparatus 60 and the object is a substrate W. The support apparatus comprises an object holder. The object holder is configured to hold an object. In the description below, an embodiment of the invention is described in the context of the support apparatus being a substrate support apparatus 60 and the object holder being a substrate holder 61 to hold a substrate W. However, in an embodiment, the object holder is, for example, a sensor holder to hold a sensor and the substrate support apparatus 60 is a support apparatus for the object holder, optionally without being able to hold a substrate.

As depicted in FIG. 6, the substrate W is held by the substrate holder 61. In an embodiment, the substrate holder 61 comprises one or more projections 62 (e.g., burls). The substrate holder 61 may be termed a pimple table or a burl table.

The substrate support apparatus 60 comprises an extraction body 65. The extraction body 65 is radially outward of the substrate holder 61. In FIG. 6, the arrow below the drawing of the substrate support apparatus 60 and the substrate W indicates the radially outward direction. In an embodiment, the extraction body 65 is shaped such that the extraction body 65 surrounds, in plan view, the substrate holder 61. In an embodiment, the extraction body 65 forms a closed shape. The shape is not particularly limited and may be an annulus or a polygon, for example.

When the edge of the substrate W is being imaged or at other times such as when the substrate W first moves under the projection system PS, the liquid 11 will pass at least partly over a gap 5 between the edge of the substrate W and the edge of the substrate support apparatus 60. This can result in liquid from the liquid reservoir 11 entering the gap 5.

An under pressure applied between the substrate W and the substrate support apparatus 60 by the substrate holder 61 helps ensure that the substrate W is held firmly in place. However, if liquid gets between the substrate W and the substrate holder 61 this can lead to difficulties, particularly when unloading the substrate W.

The extraction body 65 is configured to extract fluid from a top surface 69 of the substrate support apparatus 60. By providing an extraction opening 66, there is a reduction in the bubbles of gas that enter the liquid 11 of the liquid supply system IH. One or more of such bubbles can deleteriously affect the imaging of the substrate W. The extraction opening 66 is provided to reduce gas in the gap 5, between the substrate W and the substrate support apparatus 60, escaping into the liquid reservoir 11 in the fluid handling structure IH. If gas does escape into the liquid reservoir 11, this can lead to a bubble which floats within the liquid reservoir 11. Such a bubble, if in the path of the projection beam, can lead to imaging errors. The extraction opening 66 is to remove gas from the gap 5 between the edge of the substrate W and the edge of the recess in the substrate support apparatus 60 in which the substrate W is placed.

The extraction opening 66 extracts mostly gas (say between 20 and 100 normal liters per minute (Nl/min)) and only a small amount of immersion liquid (say about 1 to 100 ml/min, and optionally 10 to 20 ml/min). With such a two-phase flow, the immersion liquid evaporates, cooling down the substrate support apparatus 60 surrounding the edge of the substrate W. This can result in deformation of the substrate W, which may eventually lead to decreased overlay performance.

In an embodiment, the extraction body 65 is spaced from the substrate holder 61 such that the extraction body 65 is substantially decoupled from the substrate holder 61. The extraction body 65 is substantially thermally decoupled and/or substantially mechanically decoupled from the substrate holder 61. In an embodiment substantially the whole of the substrate holder 61 is spaced from substantially the whole of the extraction body 65.

By providing that the extraction body 65 is substantially decoupled from the substrate holder 61, a temperature load on the extraction body 65 has reduced impact on the thermo-mechanical behavior of the substrate holder 61. In particular, the effect of cooling down of the extraction body 65 on the substrate holder 61 is decreased. As mentioned above, such evaporative cooling can occur due to the two-phase flow through the extraction opening 66 of the extraction body 65. Accordingly, the stability of the temperature profile of the substrate holder 61 can be improved.

In an embodiment the object holder is a sensor holder configured to hold a sensor, and the extraction body is an edge seal member. In an embodiment the edge seal member comprises an extraction opening to extract immersion liquid which should find its way through the gap between the edge seal member and the sensor.

In an embodiment the object holder is a substrate table configured to hold a substrate, and the extraction body is a sensor holder. A sensor is placed next to the substrate. The sensor and the substrate are supported by different supports. In an embodiment the sensor holder comprises an extraction opening to extract immersion liquid which should find its way through the gap between the substrate table and the sensor.

In an embodiment, the extraction body 65 comprises a channel 68. The channel 68 is in fluid communication with the extraction opening 66 through a passageway 67. The extraction opening 66 may be provided at one or more discrete locations around the periphery (e.g., circumference) of the edge of the substrate W. The extraction opening 66 may, in plan, be slits or circular openings or any other shape. In an embodiment, three discrete circular openings are provided to extract a two-phase flow from the extraction body 65 to the substrate support apparatus 60. An extraction opening 66 may have a diameter of 2 mm. The channel 68 is connected to an under pressure so as to extract fluid through the opening 66 from the top surface 69 of the substrate support apparatus 60.

In an embodiment, the extraction body 65 has no connection to the substrate holder 61 such that the extraction body 65 is detached from the substrate holder 61. The extraction body 65 is not in direct contact with the substrate holder 61 at any point. This reduces heat transfer between the extraction body 65 and the substrate holder 61, particularly heat transfer by conduction. In an embodiment the gap 5, between the substrate W and the substrate support apparatus 60, is narrow such that liquid loss through the gap 5 to the bottom of the substrate holder 61 is minimal.

Figure 7:
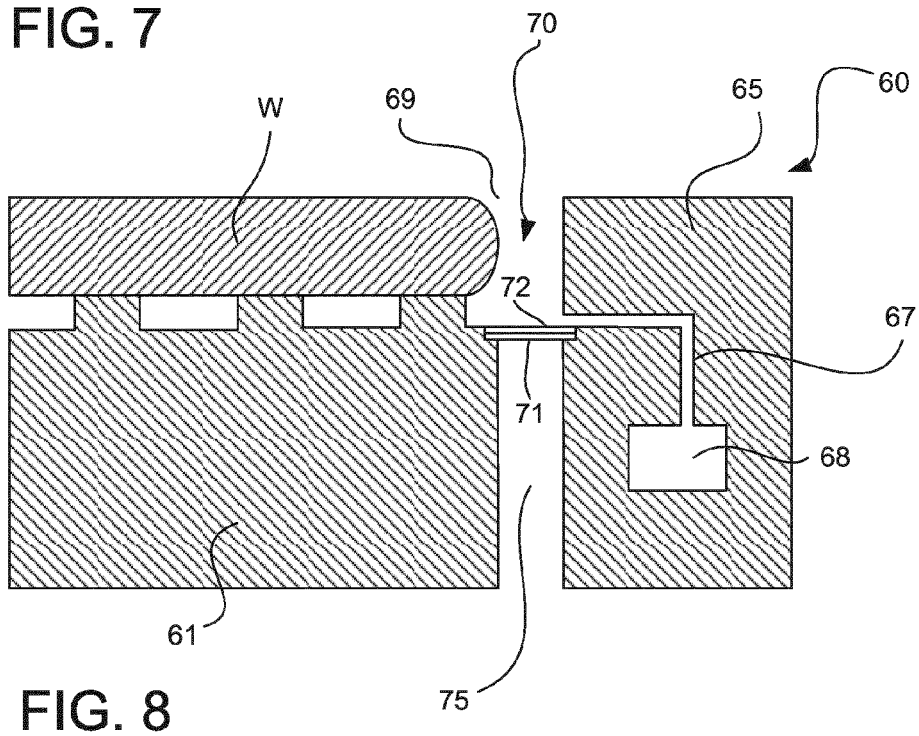

In an embodiment, the extraction body 65 is connected to the substrate holder 61. FIG. 7 depicts such an embodiment of the present invention. The extraction body 65 is substantially decoupled from the substrate holder 61. The extraction body 65 is non-rigidly connected to the substrate holder 61 by a seal. The seal is configured to bridge an intermediate gap 75 between the extraction body 65 and the substrate holder 61.

In an embodiment the seal comprises a sticker 70. The sticker 70 is arranged to reduce liquid loss through the intermediate gap 75. In an embodiment, the sticker 70 seals the intermediate gap 75. In an embodiment the seal is formed by welding, bolting or vacuum clamping, for example. The extraction opening 66 is configured to extract fluid from the gap, above the seal, between the substrate holder 61 and the extraction body 65.

In an embodiment, the sticker 70 comprises an adhesive layer 71 and a film layer 72. The adhesive layer 71 adheres the film layer 72 to the substrate holder 61 and to the extraction body 65. The sticker 70 helps prevent fluid from entering the intermediate gap 75 between the substrate holder 61 and the extraction body 65. The intermediate gap 75 prevents a good thermal contact between the substrate holder 61 and the extraction body 65. In an embodiment, the sticker 70 has a thickness of less than or equal to 50 micrometers, less than or equal 10 micrometers, or about 10 micrometers.

In an embodiment, the extraction body 65 is spaced from the substrate holder 61 by an intermediate gap 75 that comprises a vacuum or a gas. A vacuum, or near vacuum, in the intermediate gap 75 reduces the thermal transfer between the extraction body 65 and the substrate holder 61.

Figure 8:
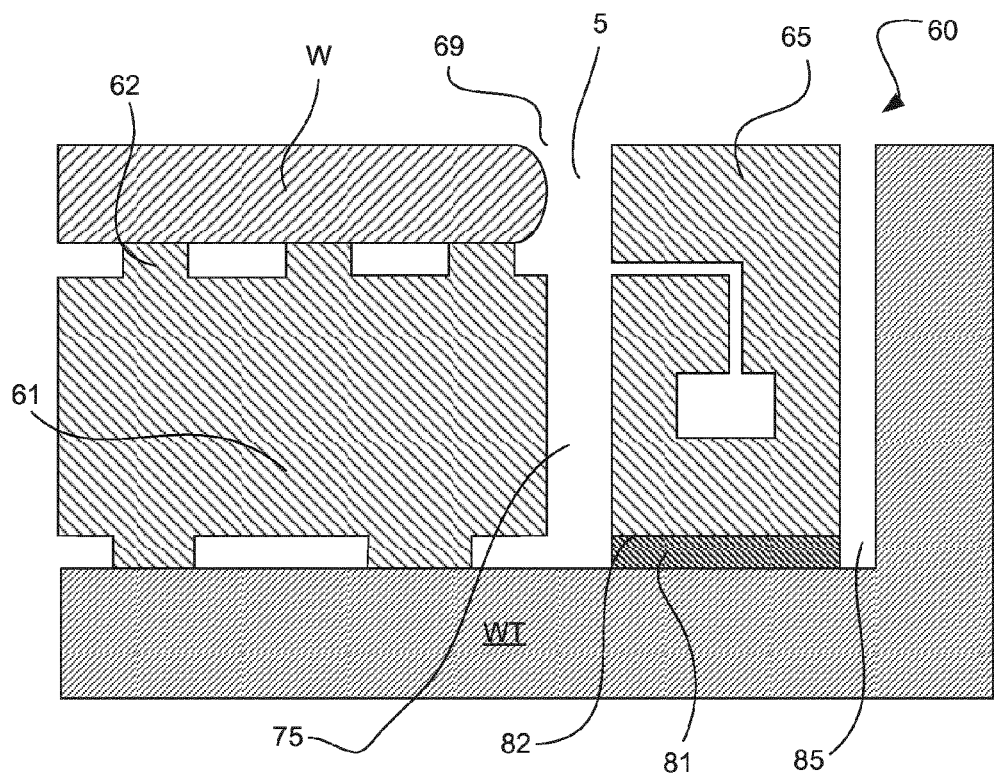
Figure 12:
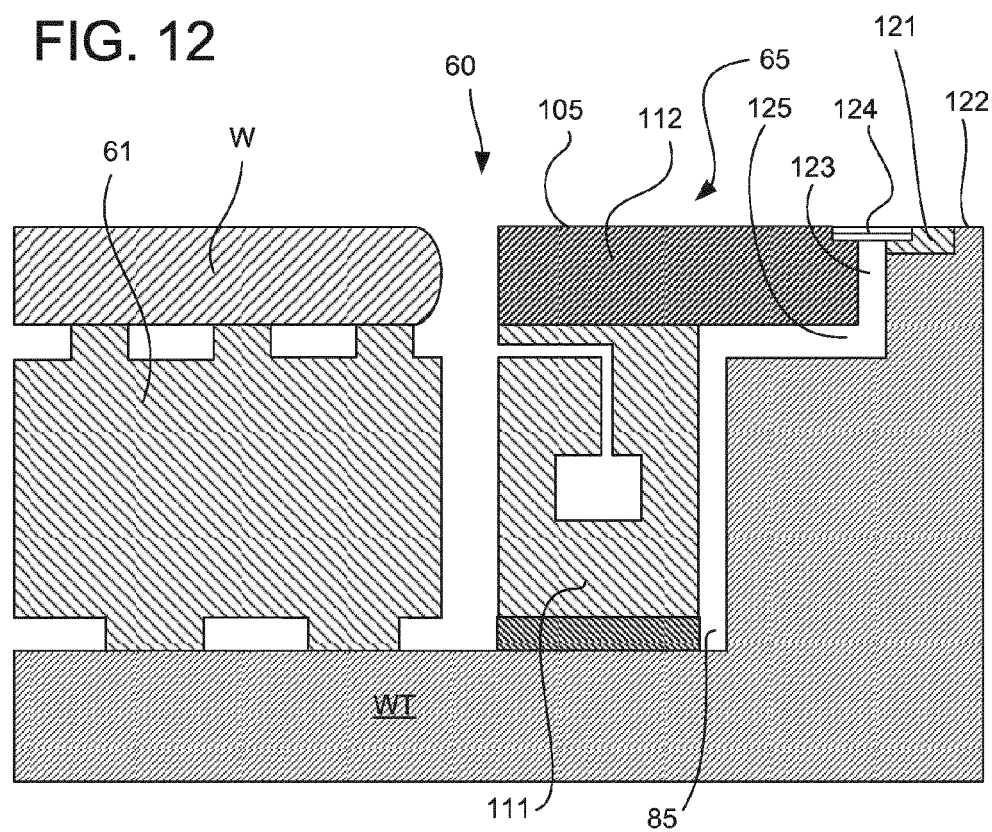

FIG. 8 depicts an embodiment of the present invention. As depicted in FIG. 8, in an embodiment the substrate support apparatus 60 comprises a substrate table WT. The substrate holder 61 is positioned within an object holder recess of the substrate table WT. In the context of the object holder being a substrate holder 61, the object holder recess is a substrate holder recess 85 of the substrate table WT. At least part of the extraction body 65 is positioned within the substrate holder recess 85. As depicted in FIG. 8, in an embodiment substantially all of the extraction body 65 is positioned within the substrate holder recess 85. However, this need not necessarily be the case. As will be explained below, and as depicted in FIG. 12 for example, in an embodiment part of the extraction body 65 extends beyond the substrate holder recess 85.

As depicted in FIG. 8, the extraction body 65 is connected to the substrate table WT at an interface 81. The interface 81 provides a connection between the extraction body 65 and the substrate table WT. Acceleration forces of the substrate WT are transferred to the extraction body 65 via the interface 81. The interface 81 provides a stiff connection to the extent that the interface 81 transfers accelerating forces from the substrate table WT to the extraction body 65. The stiffness of the connection at the interface 81 is desirably minimal so as to reduce thermal transfer between the extraction body 65 and the substrate table WT.

In an embodiment, the interface 81 is at a bottom surface 82 and/or a radial surface (e.g. a radially outward edge) of the extraction body 65. This is depicted in FIG. 8. In an embodiment, the interface 81 is at an outer surface of the extraction body 65.

The form of connection at the interface 81 is not particularly limited. In an embodiment, the extraction body 65 is connected to the substrate table WT by vacuum clamping, bolting, gluing, and/or kinematic leaf spring coupling.

In an embodiment the interface 81 comprises one or more burls. In an embodiment the connection area between the burl and the substrate table WT is smaller than the contact surface between the burl and the extraction body 65. This provides the burl with extra flexibility.

In an embodiment, the surfaces of the gap 5 are provided with a hydrophobic coating.

The hydrophobic coating helps to reduce the loss of liquid from the top surface 69 of the substrate support apparatus 60 through the intermediate gap 75.

In an embodiment, the extraction body 65 is made of the same material as the substrate holder 61. In an embodiment, both the substrate holder 61 and the extraction body 65 are formed of SiC, SiSiC, or a diamond-like material, for example. By matching the material of the extraction body 65 with the material of the substrate holder 61, thermo-mechanical cross-talk between the substrate holder 61 and the extraction body 65 can be reduced.

In an embodiment, the extraction body 65 is made from the same material as the substrate table WT. In an embodiment, both the extraction body 65 and the substrate table WT are formed from a glass-ceramic, such as Zerodur®, or cordierite, for example.

Figure 9:
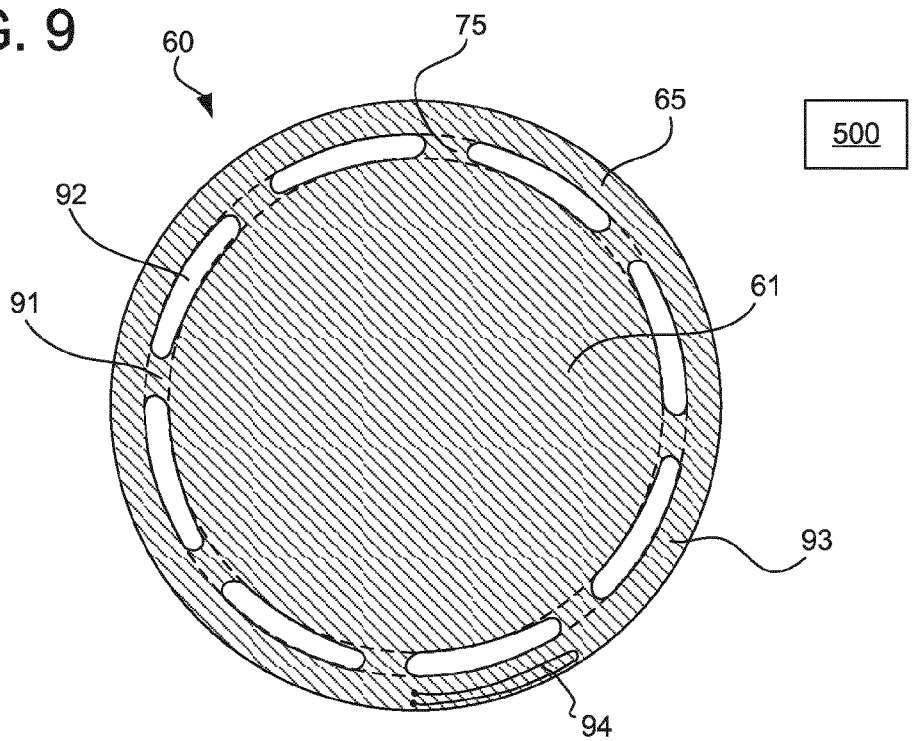
FIG. 9 depicts, in plan, a part of a support apparatus of an embodiment.

FIG. 9 depicts, in plan view, an embodiment of the present invention. In an embodiment, the extraction body 65 is connected to the substrate holder 61 by a plurality of peripherally spaced joints 91. Between the joints 91, the extraction body 65 is spaced from the substrate holder 61.

By providing that the extraction body 65 is connected to the substrate holder 61 only by the joints 91, the heat transfer between the substrate holder 61 and the extraction body 65 is reduced. This reduces the effect of evaporative cooling at the extraction body 65 on the substrate holder 61. In turn, this reduces the effects of the evaporative cooling on the substrate W. The stability of the thermal profile of the substrate holder 61 is improved.

Gaps 92 are formed between the joints 91. The gaps 92 may comprise a vacuum or a gas. The gaps 92 reduce the heat transfer between the extraction body 65 and the substrate holder 61 particularly heat transfer by conduction. In an embodiment, surfaces of the gaps 92 are provided with a hydrophobic coating.

The joints 91 provide a minimally stiff connection between the extraction body 65 and the substrate holder 61. The connection may be stiff enough such that acceleration forces are transferred from the substrate holder 61 to the extraction body 65. In an embodiment, the stiffness is minimal so as to reduce thermo-mechanical cross-talk between the substrate holder 61 and the extraction body 65.

As depicted in FIGS. 8 and 12, for example, in an embodiment, the substrate holder 61 is connected to the substrate table WT by a series of burls, for example. The burls allow acceleration forces to be transferred from the substrate table WT to the substrate holder 61, while also providing gaps between the burls that reduce thermal transfer between the substrate table WT and the substrate holder 61.

Figure 10:
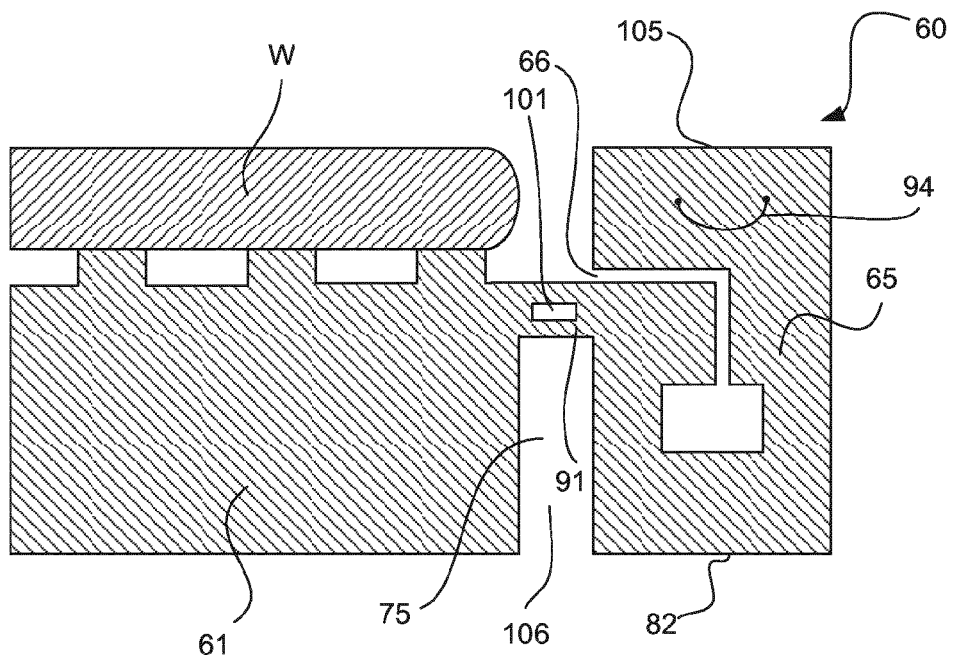
FIGS. 10-14 depict, in cross-section, a part of a support apparatus of an embodiment.

FIG. 10 depicts an embodiment of the present invention. In an embodiment, at least one of the joints 91 extends from a top surface of the substrate holder 61 only partially towards a bottom surface 82 of the extraction body 65. Directly below at least one of the joints 91, the extraction body 65 is spaced from the substrate holder 61. Below the at least one of the joints 91 a gap 106 is provided between the substrate holder 61 and the extraction body 65. The gap 106, which may comprise a vacuum or a gas, reduces heat transfer between the substrate holder 61 and the extraction body 65. The gap 106 is in fluid communication with the gaps 92.

In an embodiment, the joints 91 extend from a top surface of the substrate holder 61 to a bottom surface 82 of the extraction body 65. In an embodiment the joint 91 is monolithic with the substrate holder 61 and/or the extraction body 65. In an embodiment the joint 91 is not a separate piece from the substrate holder 61 and/or the extraction body 65. In an embodiment the extraction opening 66 is positioned above the joint 91.

In an embodiment, at least one of the joints 91 comprises a joint conditioning system 101 configured to supply heat energy to and/or remove heat energy from the joint 91 and/or between the joint 91. The joint conditioning system 101 may be any type of thermal conditioning system. Suitable thermal conditioning systems are described in further detail below and are depicted in FIGS. 15 to 19. FIGS. 15 to 19 depict suitable thermal conditioning systems applied to the main body of the extraction body 65. In particular, FIGS. 15 to 19 depict thermal conditioning systems applied to the channel 68 that is in fluid communication with the extraction opening 66. These thermal conditioning systems may be applied to the joint 91.

In an embodiment, the joints 91, in total, extend along at most 10% of a periphery between the substrate holder 61 and the extraction body 65. The periphery extends along the gaps 92 between the joints 91. At least 90% of the periphery of the intermediate gap 75 between the substrate holder 61 and the extraction body 65 consists of the gaps 92 between the joints 91. In FIG. 9, the intermediate gap 75 is represented as the region between the two dashed lines. The two dashed lines correspond to the edges of the substrate holder 61 and the extraction body 65. By providing that the joints 91 extend along at most 10% of the periphery, the thermal transfer between the subject holder 61 and the extraction body 65 can be reduced to an acceptable level.

In an embodiment, the joints 91 provide mechanical stiffness between the substrate holder 61 and the extraction body 65. In an embodiment, the joints 91, in total, extend along at least 2% or at least 5% of the periphery. This allows the joints 91 to provide an acceptable level of mechanical stiffness between the substrate holder 61 and the extraction body 65.

The substrate support apparatus 60 depicted in FIGS. 9 and 10 may be provided with a substrate table WT as depicted in FIG. 8, for example.

The number of joints 91 is not particularly limited. In an embodiment, the substrate support apparatus 60 comprises 6, 8, 10, 12, 14 or more joints 91. The number of joints 91 may be odd or even. The extraction body 65 is segmented into as many segments 93 as there are joints 91. Each segment 93 extends along the extraction body 65 from one joint 91 to an adjacent joint 91. Each segment 93 is spaced from the substrate holder 61 by a gap 92.

The extraction body 65 is mechanically and thermally connected to the substrate holder 61 only by the joints 91. This reduces the thermal cross-talk from the extraction body 65 to the substrate holder 61. The thermal conduction between the substrate holder 61 and the extraction body 65 is reduced.

A variation in temperature of the extraction body 65 can result in mechanical stress being introduced at the outer edge of the substrate holder 61. This is due to mechanical cross-talk. This mechanical cross-talk can result in local deformation of the substrate holder 61 and the substrate W.

In the embodiment depicted in FIG. 9, the mechanical cross-talk between the extraction body 65 and the substrate holder 61 acts differently compared to in a conventional system. In the segmented extraction body 65, mechanical stress is transferred to the substrate holder 61 only at the positions of the joints 91. The stress introduced in the substrate holder 61 is determined by the elongation (or contraction) of each segment 93 of the extraction body 65 as well as the stiffness of the joints 91.

The elongation of each segment 93 is influenced mainly by the average temperature of that segment 93. In order to reduce the elongation of a segment 93, the sum of all local strains within that segment 93 should desirably be reduced to 0. In this case, there would be no mechanical stress on the substrate holder 61. The term elongation above is used to mean the increase in length of a segment 93 due to variation in temperature. Contraction of the segment 93 due to variation in temperature should also be desirably reduced.

In an embodiment, at least one of the segments 93 comprises a resistive sensor 94. The resistive sensor 94 may be a thin film resistive sensor. The resistive sensor 94 is configured to measure the average temperature of the segment 93. The resistive sensor 94 is positioned on or at a surface of the extraction body 65. For example, the resistive sensor 94 may be positioned on or at a top surface 105 or on or at a bottom surface 82 of the extraction body 65.

In an embodiment, at least one of the segments 93 comprises a heater configured to apply heat energy to the extraction body 65. In an embodiment, the controller 500 is configured to control the heater based on the measurements by the resistive sensor 94 so as to maintain the average temperature of the segment 93. In an embodiment, the resistive sensor 94 is used to apply heat to the extraction body 65. This can be done, for example, applying a current to the resistive sensor 94. In this case there is no need for an additional heater.

The resistive sensor 94 measures the electrical resistance over substantially the whole length of the resistive sensor 94. In an embodiment, the resistive sensor 94 is positioned between two adjacent joints 91. The resistive sensor 94 measures the average temperature of that segment 93. The average temperature of the segment 93 corresponds to the elongation (or contraction) of the segment 93.

The thermal response of the resistive sensor 94 is very fast because of its low mass. The control performance can be increased by using the resistive sensor 94, and optionally a separate heater, compared to using conventional sensors and flex foil heaters, for example. In an embodiment the resistive sensor 94 is replaced with a thin film heater.

In an embodiment, the gaps 92 comprise a vacuum. In an embodiment, the gaps 92 are open at the upper surface of the substrate support apparatus 60. However, this need not necessarily be the case. In an embodiment, the gaps 92 may be covered or closed. For example, a thin film material/seal such as a sticker may be applied over the gaps 92, or the gaps 92 may be closed with a material that has low thermal conductivity.

Figure 11:
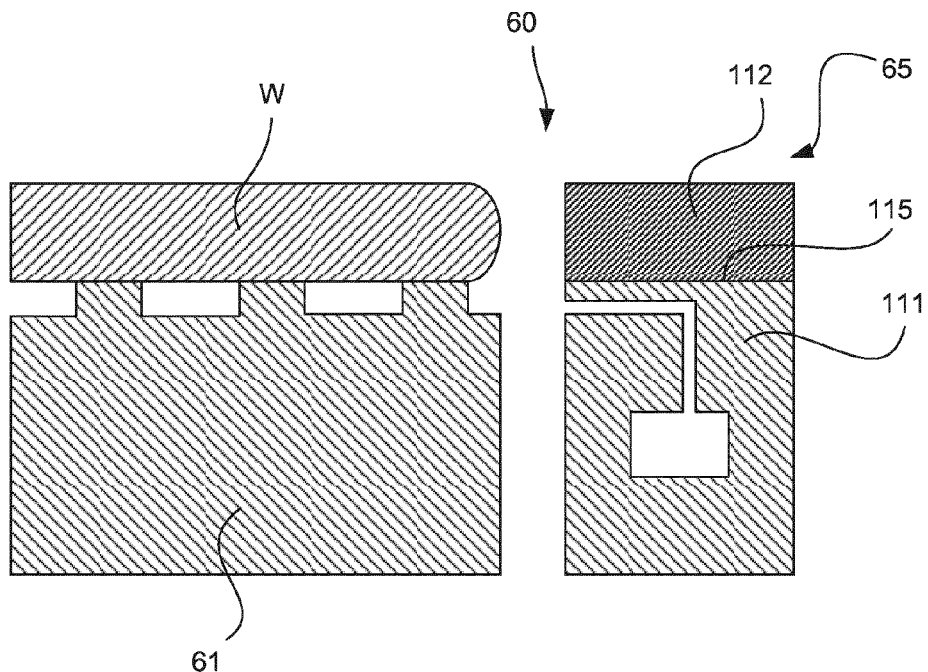

FIG. 11 depicts an embodiment of the present invention. In an embodiment, the extraction body 65 comprises a main body 111 and a cover ring 112. The cover ring 112 is positioned at a top surface 115 of the main body 111. In an embodiment, the cover ring 112 is monolithic with the main body 111. In an embodiment, the cover ring 112 is a separate body from the main body 111. By providing the cover ring 112 at the top of the extraction body 65 that would come into contact with the liquid supply device IH in normal use, a thermal load in the extraction opening 66, passageway 67 and channel 68 have a reduced thermal effect on the liquid supply device IH.

FIG. 12 depicts an embodiment of the present invention. In an embodiment, the cover ring 112 extends radially outwards beyond a radial extent of the main body 111. The extraction body 65 has a stepped profile when viewed in cross-section.

By providing that the cover ring 112 extends radially outward beyond a radial extent of the main body 111, less of the top surface 122 of the substrate table WT comes into contact with the liquid reservoir 11 in use of the lithographic apparatus. In an embodiment, the top surface 122 of the substrate table WT is provided with a hydrophobic coating. The hydrophobic coating helps to reduce the evaporation load on the substrate table WT. When the liquid reservoir 11 comes into contact with the top surface 122 of the substrate table WT, the hydrophobic coating can degrade. This can result in an increase in liquid loss and an increased evaporation load. The evaporation load can result in deformation of the substrate table WT.

The cover ring 112 can protect part of the substrate table WT. When the liquid reservoir 11 comes into contact with the cover ring 112, there is an evaporation load generated on the cover ring 112 (and a corresponding reduction in evaporation load on the top surface 122 of the substrate table WT). The thermal load due to the fluid handling structure IH has a reduced effect on the substrate table WT. This improves the stability of the temperature profile of the substrate table WT.

In an embodiment, a part of the cover ring 112 that extends radially outward beyond the radial extent of the main body 111 is positioned within a cover ring recess 125 of the substrate table WT. In an embodiment, the cover ring recess 125 is radially outward of the substrate holder recess 85. The cover ring recess 125 is shallower than the substrate holder recess 85 such that the cover ring recess 125 and the substrate holder recess 85 form stepped recesses of the substrate table WT.

In an embodiment, when the substrate W is held by the substrate holder 61, the top surface of the substrate W is substantially coplanar with the top surface 105 of the extraction body 65. In an embodiment, the top surface 105 of the extraction body 65 is substantially coplanar with the top surface 122 of the substrate table WT.

In an embodiment, the cover ring 112 extends substantially to a fiduciary marker 121 at a top surface 122 of the substrate table WT. However, this need not necessarily be the case. In an embodiment, the fiduciary marker 121 is spaced from the cover ring recess 125 of the substrate table WT.

In an embodiment, a gap 123 between the cover ring 112 and the fiduciary marker 121 (or the top surface 122) at the top surface 122 of the substrate table WT is bridged by a thin film seal 124. The thin film seal 124 comes in various constructions, which may be the same as the various possible constructions of the sticker 70 described in relation to FIG. 7.

By providing that the cover ring 112 extends over a part of the substrate table WT that would normally come into contact with the liquid supply device IH, a thermal load in the substrate table WT has a reduced effect on the liquid supply device IH and in particular on the liquid lens of the lithographic apparatus. This improves overlay and focus of the lithographic apparatus. In an embodiment the cover ring 112 is thermally conditioned in a similar way to joints 91. In an embodiment the cover ring 112 is arranged so as to provide a thermal shield against possible sources of heating and/or cooling of the substrate table WT. This may be achieved by providing thermal insulation between the cover ring 112 and the substrate table WT.

In an embodiment, the cover ring 112 has a thickness of at least 3 mm. In an embodiment, the cover ring 112 has a thickness so as to be stiff such that there is substantially no contact needed between the bottom of the cover ring 112 and the surface of the substrate table WT that is directly below the cover ring 112 in use of the lithographic apparatus. However, in an embodiment, a non-rigid local connection is provided between the bottom surface of the cover ring 112 and the opposing surface of the substrate table WT. In an embodiment, the non-rigid local connection has very low thermal conductivity so as to reduce thermal transfer between the substrate table WT and the cover ring 112 of the extraction body 65.

Figure 13:
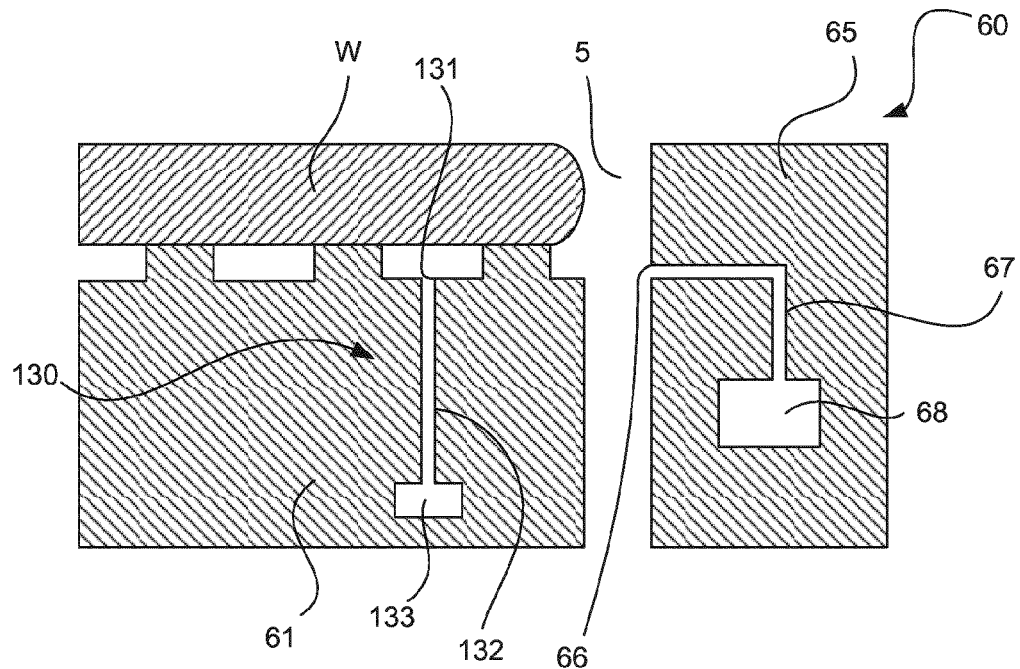

FIG. 13 depicts an embodiment of the present invention. In an embodiment, the substrate support apparatus 60 comprises a liquid extractor 130. The liquid extractor 130 is radially inward of the extraction opening 66. The liquid extractor 130 is configured to extract liquid from a top surface of the substrate holder 61.

The liquid extractor 130 is provided to help prevent any liquid which finds its way from the gap 5 to underneath the substrate W from preventing efficient release of the substrate W from the substrate holder 61 after imaging. The provision of the liquid extractor 130 reduces or eliminates a problem which may occur due to liquid finding its way underneath the substrate W. The liquid extractor 130, like the extraction opening 66, removes fluid by way of an under pressure.

The liquid extractor 130 comprises an opening 131 and a channel 133. The channel 133 is in fluid communication with the opening 131 through a passageway 132. The opening 131 may be provided at one or more discrete locations around the periphery of the edge of the substrate W and may, in plan, be slits or circular openings or any other shape. In an embodiment, three discrete (circular) openings 131 are provided around the edge of the substrate W, for instance.

Figure 14:
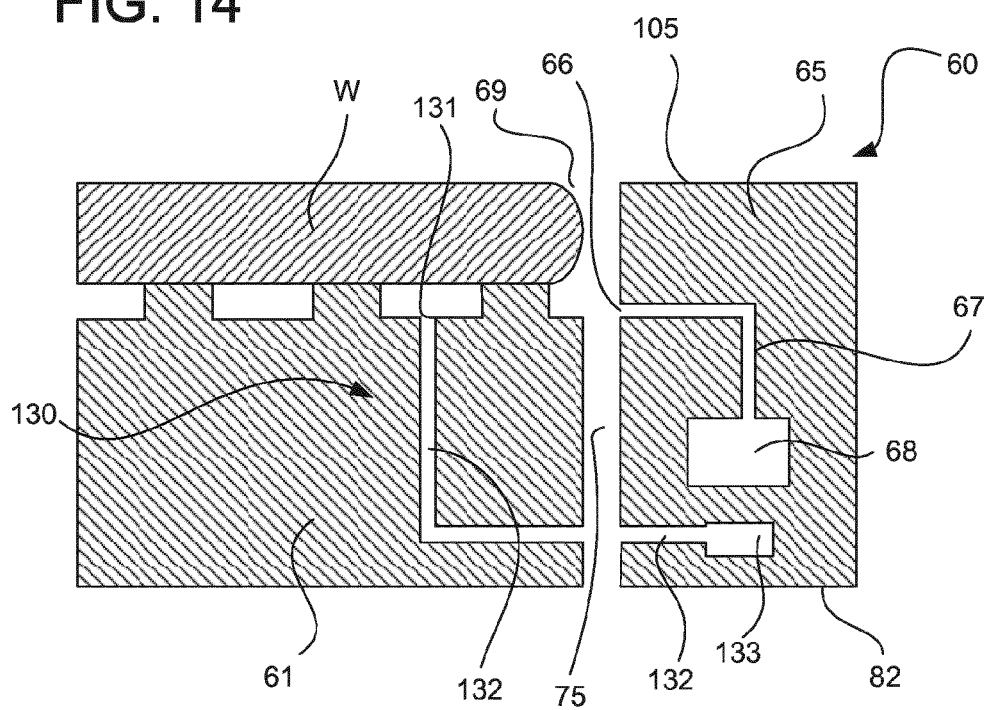

FIG. 14 depicts an embodiment of the present invention. In an embodiment, the extraction body 65 comprises at least part of the liquid extractor 130. In an embodiment, the channel 133 is provided in the extraction body 65. In an embodiment, the passageway 132 spans the intermediate gap 75 between the extraction body 65 and the substrate holder 61. In an embodiment the intermediate gap 75 is narrow such that liquid loss to the bottom of the substrate holder 61 is minimal.

By providing at least part of the liquid extractor 130 in the extraction body 65, the thermal load at the liquid extractor 130 has a reduced effect on the substrate holder 61.

In an embodiment, the liquid extractor 130 comprises a liquid extractor conditioning system configured to supply heat energy to and/or remove heat energy from the liquid extractor 130. The liquid extractor conditioning system is a thermal conditioning system. Suitable thermal conditioning systems are described below and depicted in FIGS. 15 to 19. In FIGS. 15 to 19, thermal conditioning systems are depicted in the context of thermal conditioning systems for the channel 68 in fluid communication with the extraction opening 66 of the extraction body 65. These thermal conditioning systems are equally applicable to the liquid extractor 130, and in particular to the channel 133 of the liquid extractor 130.

In an embodiment, the extraction body 65 is positioned between the substrate holder 61 and the substrate table WT. In an embodiment, the extraction opening 66 is configured to extract both a gas and a liquid from a top surface 69 of the substrate support apparatus 60. In an embodiment, a space between the extraction body 65 and the substrate holder 61 is continuous peripherally and continuous from a top surface 105 of the extraction body 65 to a bottom surface 82 of the extraction body 65.

FIGS. 15 to 19 depict thermal conditioning systems according to an embodiment of the present invention. In FIGS. 15 to 19, the thermal conditioning systems are applied to parts of the extractor of the extraction body 65. The thermal conditioning systems can be applied to the liquid extractor 130 and/or to the joints 91 and/or to other parts of the substrate support apparatus 60. The thermal conditioning systems depicted in FIGS. 15 to 19 may be combined with each other.

In an embodiment, the extraction body 65 comprises an extraction body conditioning system configured to supply heat energy to and/or remove heat energy from the extraction body 65. The extraction body conditioning system is a thermal conditioning system.

Figure 15:
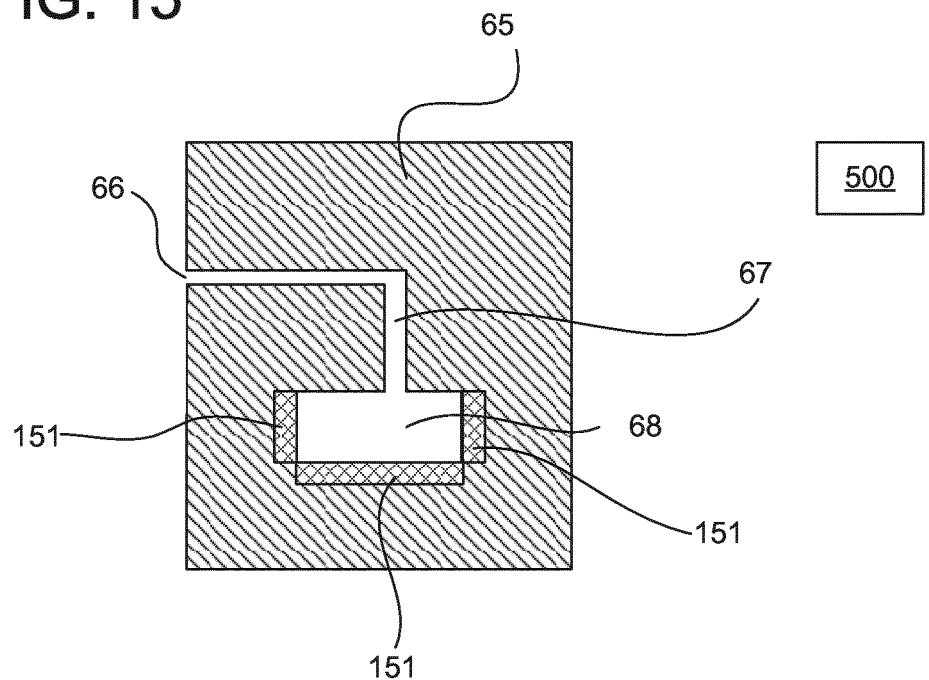
FIGS. 15-19 depict, in cross-section, a thermal conditioning system of an embodiment.

FIG. 15 depicts a thermal conditioning system according to an embodiment of the present invention. In an embodiment, the thermal conditioning system comprises a plurality of conditioning units that are independently controllable. Each of the plurality of conditioning units is configured to supply heat energy to and/or remove heat energy from a respective conditioning region of the extraction body 65. In an embodiment, a conditioning unit comprises a heater/temperature sensor 151. In an embodiment, the heater/temperature sensors are positioned adjacent to the channel 68 that is in fluid communication with the extraction opening 66 of the extraction body 65.

The heater/temperature sensors 151 are independently controllable. The temperature sensor is configured to sense the temperature of the channel 68. The heater is configured to supply heat energy to the channel 68. In an embodiment, the controller 500 controls the heater/temperature sensors 151 so as to maintain the channel 68 (or another component of the substrate support apparatus 60) at a certain (e.g., predetermined) temperature.

Figure 16:
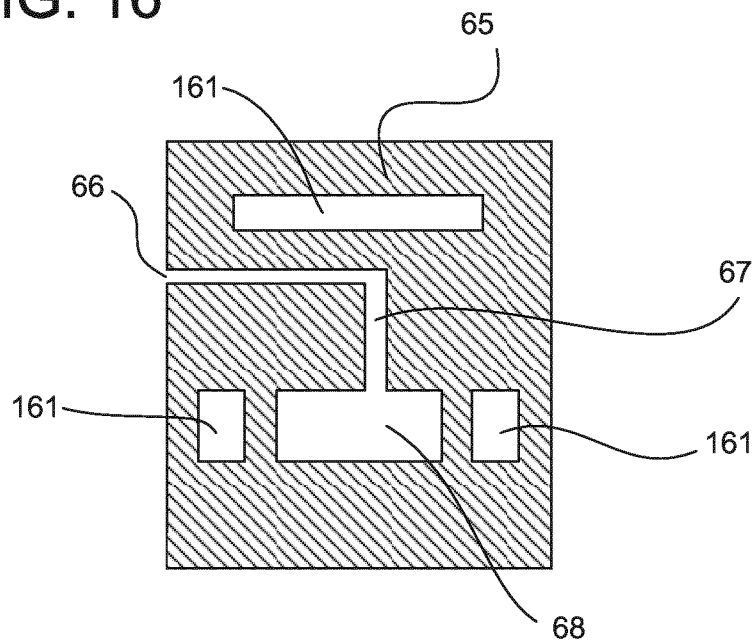

FIG. 16 depicts a thermal conditioning system according to an embodiment of the present invention. In an embodiment, the thermal conditioning system comprises a network of fluid-carrying channels 161 configured to control the temperature of the component, such as the extraction body 65 in the depiction of FIG. 16. In an embodiment, the fluid-carrying channels 161 carry a thermal conditioning liquid. The thermal conditioning liquid may be water, for example. The fluid-carrying channels 161 maintain the temperature of the extraction body 65 at a certain (e.g., predetermined) temperature. In an embodiment, one or more heater/temperature sensors (not shown) may be positioned in or near the fluid-carrying channels 161 so as to control the temperature of the thermal conditioning liquid within the fluid-carrying channels 161.

In an embodiment the fluid-carrying channels 161 carry a phase change material. In such a system the phase change material is chosen such that it changes phase at a desired set point temperature and is therefore capable of transferring heat much more efficiently than a fluid which does not change phase.

In an embodiment, the fluid-carrying channels 161 carry carbon dioxide as the fluid. The fluid-carrying channels 161 may be termed cooling channels. In an embodiment, the fluid-carrying channels 161 contain carbon dioxide at a pressure such that the carbon dioxide has a boiling point of at most 30° C., and optionally at most 22° C. The carbon dioxide helps maintain the temperature of the extraction body 65. For example, excess heat in the extraction body 65 above the boiling point of the carbon dioxide contained in the fluid-carrying channels 161 can be transferred to the carbon dioxide. This excess heat causes the carbon dioxide to boil.

Figure 17:
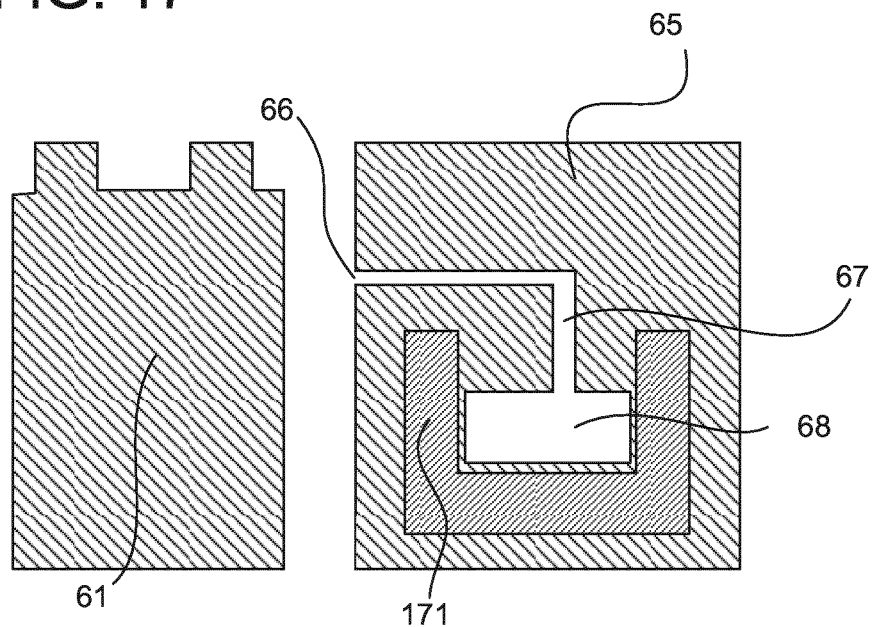

FIG. 17 depicts a thermal conditioning system according to an embodiment of the present invention. In an embodiment, the thermal conditioning system comprises a heat pipe 171. In an embodiment, the heat pipe 171 is positioned around the channel 68. By providing a heat pipe 171 around the channel 68, the temperature of the channel 68 can be easily controlled. This is due to the fact that a heat pipe 171 has a very large "conductivity".

In an embodiment, at least a part of the heat pipe 171 is positioned between the channel 68 and the substrate holder 61. This reduces the transfer of heat between the extraction body 65 and the substrate holder 61. The temperature of the heat pipe 171 is very homogeneous due to the homogeneous pressure within the heat pipe 171. The heat pipe 171 contains a working fluid that can evaporate to vapor, thereby absorbing thermal energy. The vapor migrates along the cavity of the heat pipe 171 to a region at a lower temperature. The vapor then condenses back into the working fluid and is absorbed by a wick in the heat pipe 171. This condensation releases thermal energy. The working fluid then flows back to a higher temperature region of the heat pipe 171. In this way, the temperature of the heat pipe 171 remains substantially homogeneous.

In an embodiment, the heat pipe 171 comprises a working fluid selected from the group consisting of water, acetone, ethanol, methanol, ammonia, 2-butane, DME, 1,1,1,2-tetrafluoroethane and propane. Other working fluids may be suitable.

Figure 19:
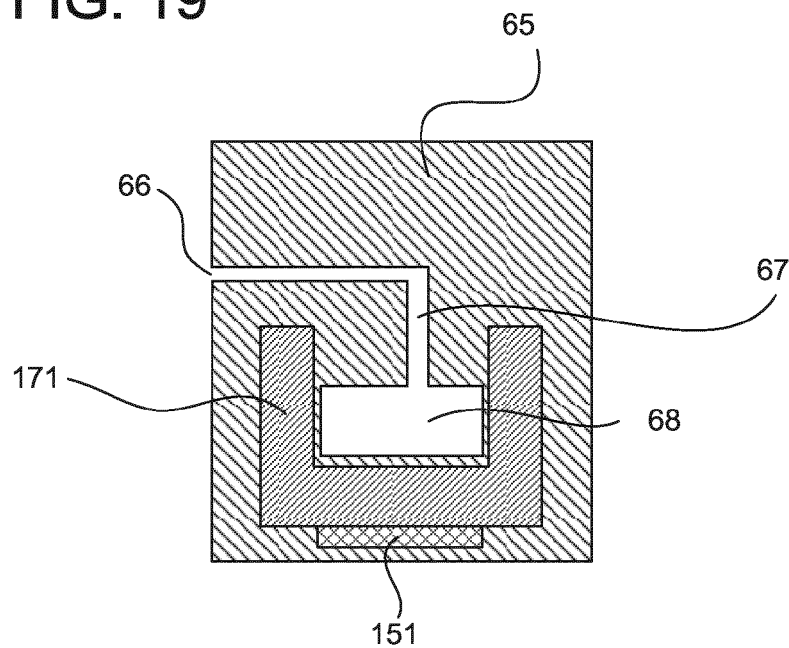

FIG. 19 depicts a thermal conditioning system according to an embodiment of the present invention. As depicted in FIG. 19, the thermal conditioning system may comprise a heat pipe 171 and at least one heater/temperature sensor 151. The heater/temperature sensor is configured to apply energy to the heat pipe 171. This sets the saturation pressure for the working fluid in the heat pipe 171.

Figure 18:
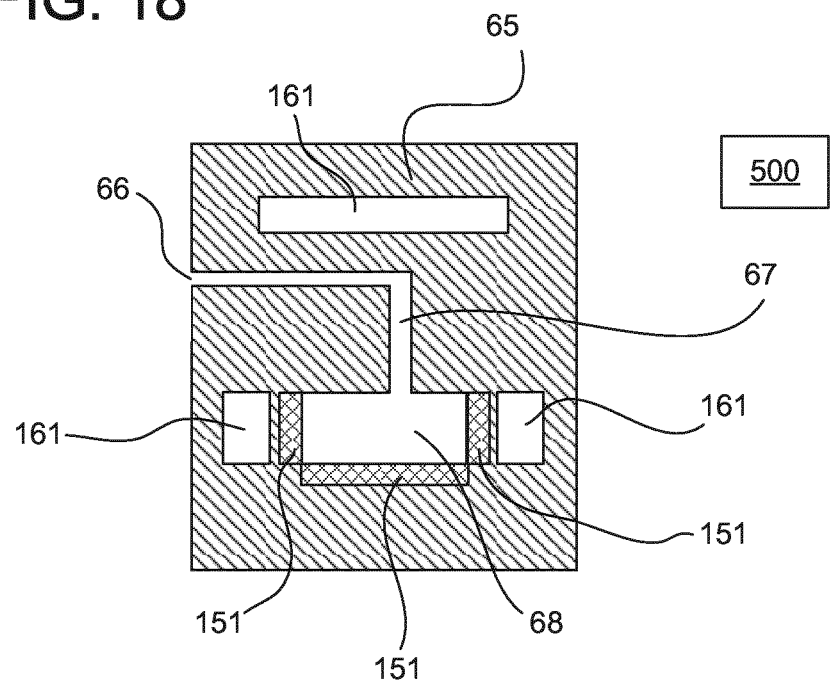

FIG. 18 depicts a thermal conditioning system according to an embodiment of the present invention. In the embodiment depicted FIG. 18, the heater/temperature sensors 151 are combined with the fluid-carrying channels 161. In an embodiment, the thermal conditioning system is provided within the extraction body 65 around the channel 68. In an embodiment, the controller 500 controls the thermal energy provided by the heater/temperature sensor 151 to the channel 68.

The energy provided to the heater/temperature sensor 151 may be electrical. The heater/temperature sensor 151 converts the electrical energy into heat energy. If the electrical energy provided to the heater/temperature sensor 151 is too low, then the thermal energy provided by the heater/temperature sensor 151 will be too low. If the electrical energy provided to the heater/temperature sensor 151 is too high, then the thermal energy provided by the heater/temperature sensor 151 will be too high. This can lead to the temperature of the extraction body 65 being too low or too high. By providing that the heater/temperature sensors 151 are independently controllable, this potential error can be reduced.

By providing additionally the network of fluid-carrying channels 161, the stability of the temperature of the extraction body 65 can be improved. If there is excess heat provided by the heater/temperature sensors 151, then the excess heat will be absorbed by the evaporation of the carbon dioxide, for example, contained within the fluid-carrying channels 161.

In an embodiment, the controller 500 is configured to control the pressure of the carbon dioxide within the fluid-carrying channels 161 to be about $6 \times 10^6$ Pa. Another fluid instead of or in addition to carbon dioxide may be used in the fluid-carrying channels 161.

Figure 20:
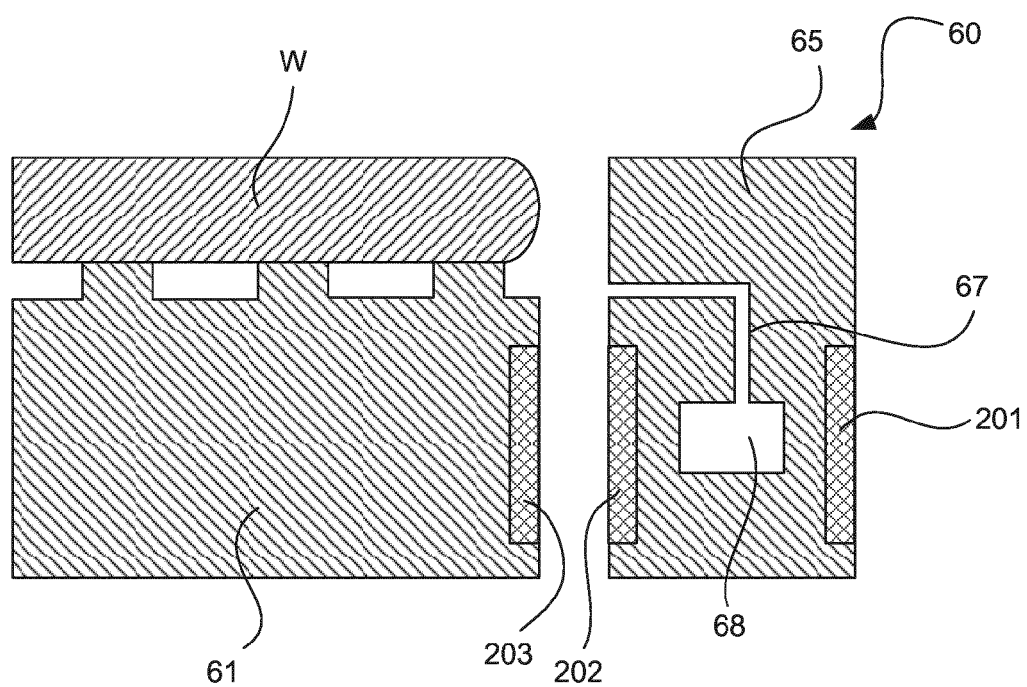

FIG. 20 depicts an embodiment of the present invention. In an embodiment, the extraction body 65 comprises an edge heater 201 on an outer edge of the extraction body 65. In an embodiment, the extraction body 65 comprises an edge heater 202 on an inner surface of the extraction body 65. In an embodiment, the substrate holder 61 comprises an edge heater 203 positioned at an outer edge of the substrate holder 61. In an embodiment, the edge heaters 201, 202, 203 are independently controllable by the controller 500. The edge heaters 201, 202, 203 help maintain stability of the temperature profile of the substrate support apparatus 60. Each of the edge heaters 201, 202, 203 may comprise a temperature sensor.

FIGS. 21 to 26 depict specific embodiments of the invention formed by combining feature described above. Further specific embodiments may be formed by other combinations of the possible features described herein.

FIG. 21 depicts an embodiment of the present invention. In the embodiment depicted in FIG. 21, the liquid extractor 130 is provided in the substrate holder 61. The substrate holder 61 is thermally conditioned by a network of fluid-carrying channels 161. The extraction body 65 is thermally conditioned by a network of fluid-carrying channels 161. The cover ring 112 of the extraction body 65 is thermally conditioned by a fluid-carrying channel 161.

FIG. 22 depicts an embodiment of the present invention. In the embodiment depicted in FIG. 22, the liquid extractor 130 is provided in the substrate holder 61. The substrate holder 61 comprises a network of fluid-carrying channels 161 configured to control the temperature of the substrate holder 61. The substrate holder 61 comprises an edge heater 203 positioned at an outer edge of the substrate holder 61. The extraction body 61 comprises edge heaters 201, 202 at the outer edge and the inner edge of the extraction body 65.

Figure 23:
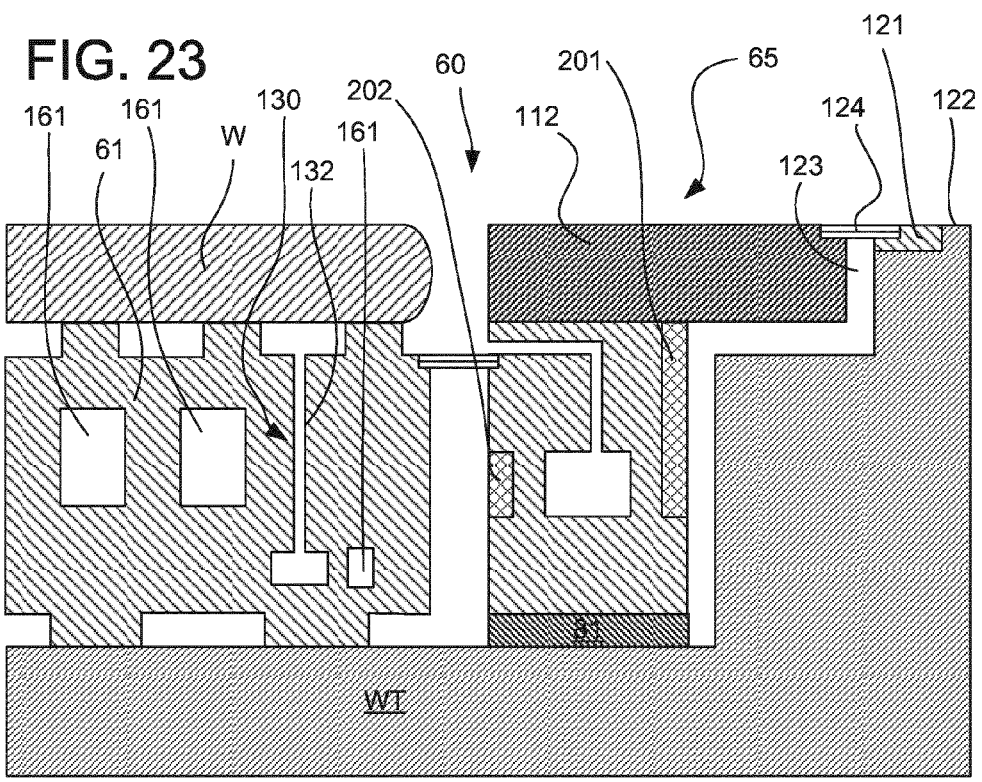

FIG. 23 depicts an embodiment of the present invention. In the embodiment depicted in FIG. 23, the liquid extractor 130 is provided in the substrate holder 61. The substrate holder 61 is thermally conditioned by a network of fluid-carrying channels 161. The extraction body 65 comprises edge heaters 201, 202 at the outer edge and the inner edge of the extraction body 65.

Figure 24:
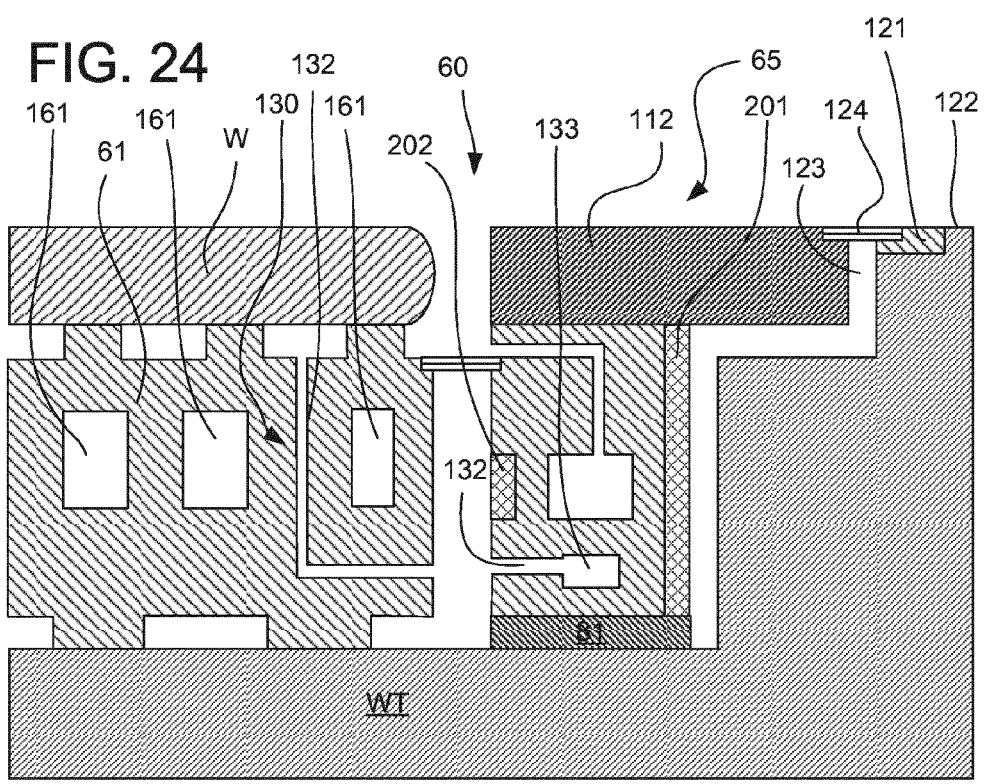

FIG. 24 depicts an embodiment of the present invention. In the embodiment depicted in FIG. 24, part of the liquid extractor 130 is provided in the extraction body 65. The channel 133 is provided in the extraction body 65. Part of the passageway 132 is provided in the extraction body 65. The substrate holder 61 comprises a network of fluid-carrying channels 161 configured to control the temperature of the substrate holder 61. The extraction body 65 comprises edge heaters 201, 202 at the outer edge and the inner edge of the extraction body 65. The edge heaters 201, 202 are configured to control the temperature of the extraction body 65. The embodiment depicted in FIG. 24 may be modified by replacing the edge heater 201, 202 with fluid-carrying channels 161.

Figure 25:
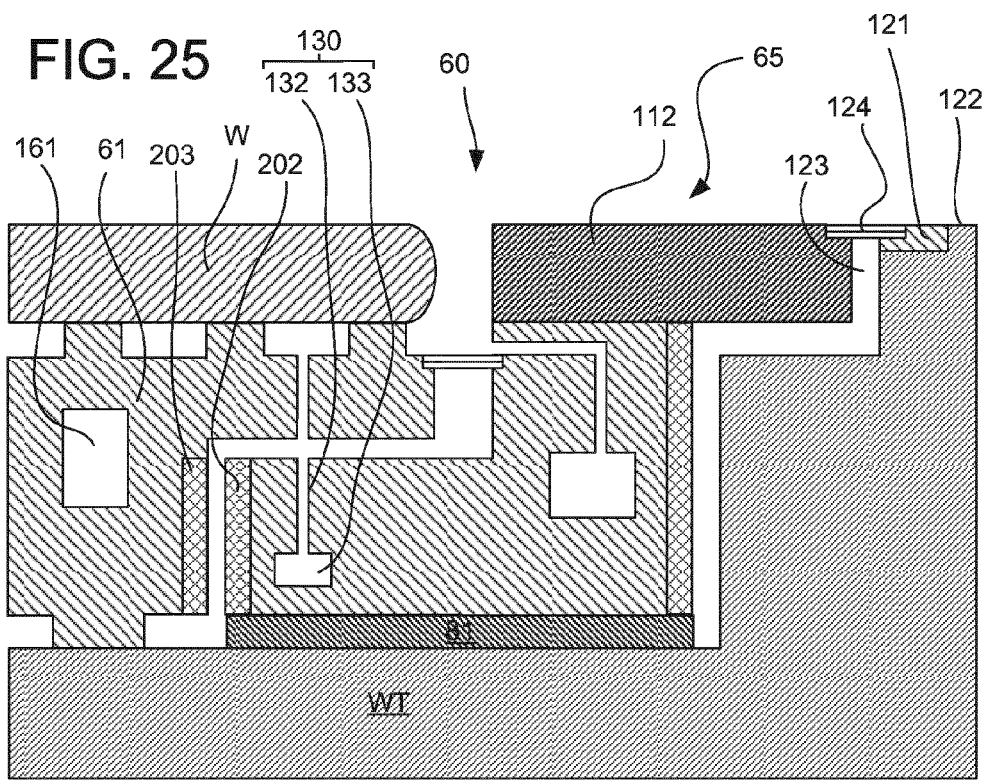

FIG. 25 depicts an embodiment of the present invention. In the embodiment depicted in FIG. 25, part of the liquid extractor 130 is provided in the extraction body 65. The channel 133 is provided in the extraction body 65. Part of the passageway 132 is provided in the extraction body 65. The extraction body 65 has a stepped shape that corresponds to a stepped shape of the substrate holder 61. The channel 133 of the liquid extractor 130 is provided in a part of the extraction body 65 directly below a part of the substrate holder 61.

In the embodiment depicted in FIG. 25, the substrate holder 61 comprises a network of fluid-carrying channels 161 configured to control the temperature of the substrate holder 61. The substrate holder 61 comprises an edge heater 203 at an outer edge of the substrate holder. The extraction body 65 comprises edge heaters 201, 202 at the outer and inner edges of the extraction body 65. The embodiment depicted in FIG. 25 may be modified by replacing the edge heater 201, 202, 203 with fluid-carrying channels 161.

Figure 26:
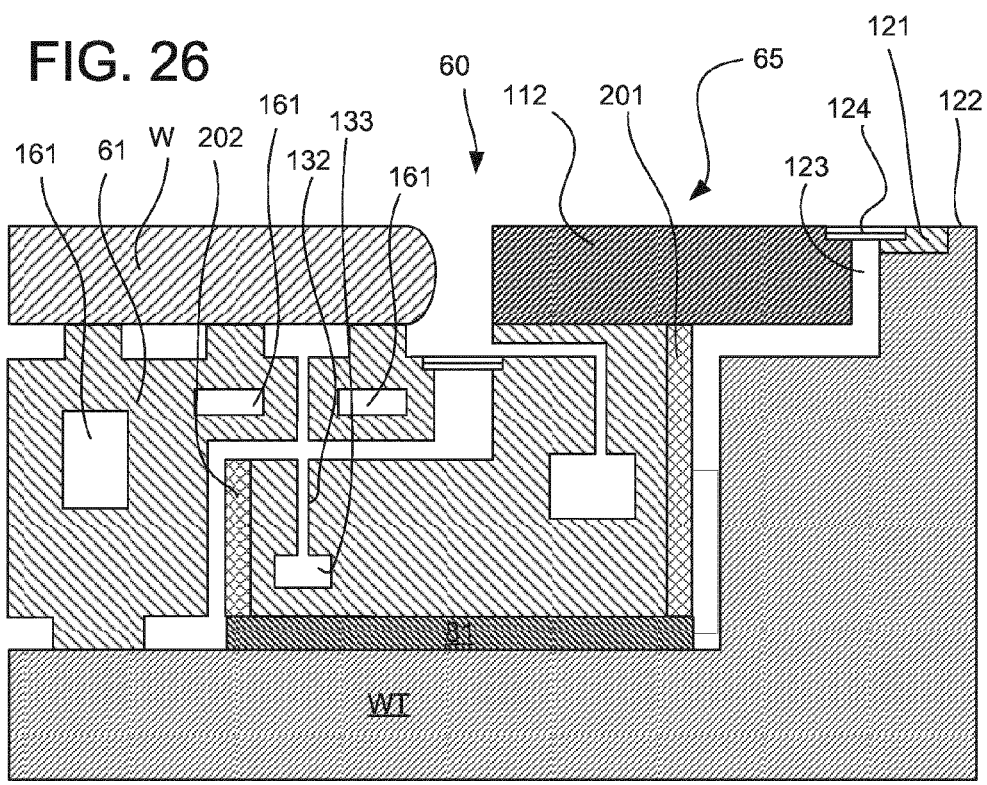

FIG. 26 depicts an embodiment of the present invention. In the embodiment depicted in FIG. 26, part of the liquid extractor 130 is provided in the extraction body 65. The channel 133 is provided in the extraction body 65. Part of the passageway 132 is provided in the extraction body 65. The extraction body 65 has a stepped shape that corresponds to a stepped shape of the substrate holder 61, as in FIG. 25. The substrate holder 61 comprises a network of fluid-carrying channels 161 configured to control the temperature of the substrate holder 61. The extraction body 65 comprises edge heaters 201, 202 positioned at outer and inner edges of the extraction body 65. A fluid-carrying channel 161 is provided in the substrate holder 61 radially outward of the passageway 132 that connects the channel 133 with the opening 131 of the liquid extractor 130. The embodiment depicted in FIG. 26 may be modified by replacing the edge heater 201, 202 with fluid-carrying channels 161.

In the embodiments depicted in FIGS. 24 to 26, the cover ring 112 may be thermally conditioned by one or more heater/temperature sensors, by single-phase conditioning, by two-phase conditioning, by one or more Peltier elements, by one or more fluid-carrying channels, or by any combination of these components.

During use of the lithographic apparatus, the substrate table WT moves relative to the liquid confinement structure IH such that the liquid confinement structure IH is at a position directly over the substrate table WT. In an embodiment the substrate table WT is actuated to move relative to the liquid confinement structure IH. The temperature of the liquid in the space 11 may be required to be controlled to within a few thousandths of a Kelvin. This is because the temperature of the liquid in the space 11 affects the refractive index of the effective lens of the lithographic apparatus.

When the substrate table WT moves relative to the liquid confinement structure IH such that the liquid confinement structure IH is at a position over the substrate table WT, heat may be transferred between the liquid in the space 11 and the substrate table WT. This heat transfer can undesirably cause the temperature of the liquid in the space 11 to vary. It is desirable to provide a support apparatus 60 in which the heat transfer between the substrate table WT and the liquid in the space 11 is reduced.

Figure 27:
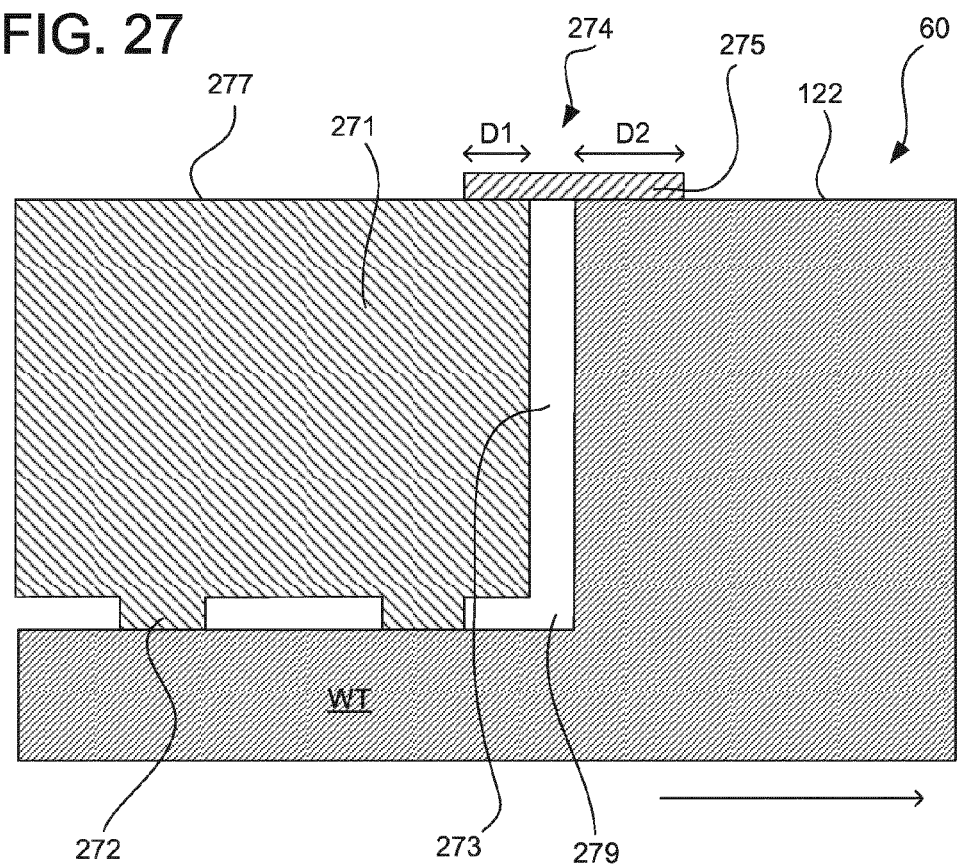

FIG. 27 depicts, in cross-section, part of a support apparatus 60 according to an embodiment of the invention. The support apparatus 60 comprises a table, such as a substrate table WT, and a body 271. The body 271 is positioned within a recess 279 of the substrate table WT. There is a gap 273 between the body 271 and the substrate table WT.

As depicted in FIG. 27, the support apparatus 60 comprises a member 274 bridging the gap 273. The member 274 may be termed a seal member or a seal. The member 274 extends from a top surface 277 of the body 271 to a top surface 122 of the substrate table WT. Part of the member 274 is on the top surface 277 of the body 271. Part of the member 274 is positioned on the top surface 122 of the substrate table WT.

The substrate table WT is formed of a table material having a thermal conductivity. The member 274 comprises a thermal resistance layer 275. The thermal resistance layer 275 is formed of a thermal resistance material. The thermal resistance material has a lower thermal conductivity than the thermal conductivity of the table material.

The member 274 reduces the heat transfer between the substrate table WT and the liquid in the space 11 when the liquid confinement structure IH is directly over the substrate table WT. The thermal resistance layer 275 serves as a resistance to heat transferring out of the substrate table WT towards the liquid in the space 11 and to heat transferring out of the liquid in the space 11 towards the substrate table WT. Due to the low heat conductivity coefficient of the thermal resistance layer 275, the heat transfer from the table material towards the liquid in the space 11 is reduced significantly compared to the situation in which the substrate table WT is in direct contact with the liquid in the space 11 during use of the lithographic apparatus. Member 274 provides a thermal shield (e.g. a thermal isolator or thermal insulation) which substantially reduces heat transfer between the liquid in the space 11 and the substrate table WT.

The member 274 may be combined with any of the embodiments described herein, particularly those described in relation to FIGS. 6 to 26. In an embodiment, the body 271 is an extraction body 65 as described above. In an embodiment, the body 271 may be a substrate holder 61, or a sensor, for example. In the case that the body 271 is the extraction body 65, the top surface 277 of the body 271 corresponds to the top surface 105 of the extraction body 65.

In an embodiment, the extraction body 65 and the substrate holder 61 are not thermally decoupled from each other. In an embodiment, the extraction body 65 and the substrate holder 61 form a single component. The member 274 may extend from that single component to the top surface 122 of the substrate table WT. In an embodiment, the gap 273 corresponds to the intermediate gap 75 as described above. In an embodiment, the recess 279 corresponds to the substrate holder recess 85 as described above.

As depicted in FIG. 27, in an embodiment, the body 271 is connected to the substrate table WT via a plurality of burls 272. Instead of the burls 272, the body 271 may be connected to the substrate table WT by other means such as a vacuum clamp, a bolt, glue and/or a kinematic leaf spring coupling.

Figure 28:
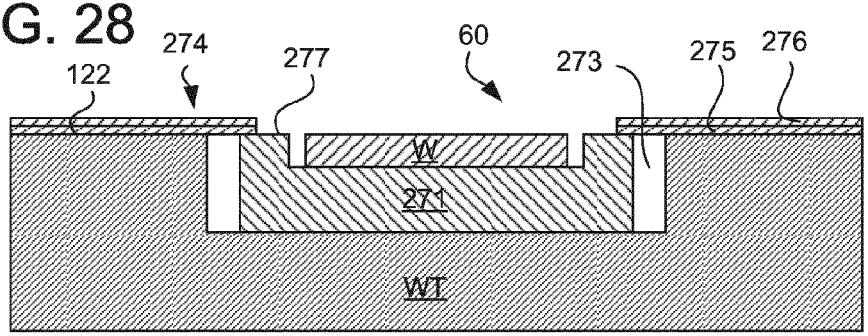

FIG. 28 depicts, in cross-section, a support apparatus 60 according to an embodiment of the invention. In an embodiment, more of the member 274 is on the top surface 122 of the substrate table WT than on the top surface 277 of the body 271. In an embodiment, the member 274 extends, radially, further outwards along the top surface 122 of the substrate table WT than inwards along the top surface 277 of the body 271. This means, referring to FIG. 27, that the distance D2 is greater than distance D1.

The distance D2 indicates the extent to which the member 274 extends (e.g., radially) outwards along the top surface 122 of the substrate table WT. The distance D2 is measured in the outward (radial) direction from the inner edge of the recess 279 to the outer edge of the member 274. The arrow at the bottom of FIG. 27 represents the (radially) outward direction. The distance D1 corresponds to the extent by which the member 274 extends (radially) inwards along the top surface 277 of the body 271. The distance D1 is calculated from the outer edge of the body 271 to the inner edge of the member 274.

By providing that the member 274 is more on the top surface 122 of the substrate table D2 than on the top surface 277 of the body 271, the member 274 more efficiently reduces the thermal transfer between the substrate table WT and the liquid in the space 11 of the liquid confinement structure IH.

As depicted in FIG. 28, in an embodiment the member 274 extends over substantially all of the top surface 122 of the substrate table WT. In an embodiment, the member 274 is substantially continuous. The member 274 may surround one or more components, such as one or more sensors, that are on the substrate table WT. The member 274 can prevent the liquid in the space 11 from coming into direct contact with the substrate table WT. The member 274 may reduce the thermal transfer between all points of the top surface 122 of the substrate table WT with the liquid in the space 11.

In an embodiment, the member 274 comprises a thermal adaptation layer 276. The thermal adaptation layer 276 is formed of a thermal adaptation material. Here the term thermal adaptation material is used to refer to the material that forms the thermal adaptation layer 276. The thermal adaptation material adapts its temperature to the same temperature as the liquid in the space 11. The thermal adaptation material has a lower specific heat capacity at 25° C. than a specific heat capacity at 25° C. of the table material. When the substrate table WT moves relative to the liquid confinement structure IH such that the liquid confinement structure IH is at a position directly over the substrate table WT, the liquid in the space 11 may come into direct contact with the member 274. When the liquid in the space 11 comes into contact with the member 274 comprising the thermal adaptation layer 276, the member 274 adapts its temperature to the temperature of the liquid relatively quickly.

In an embodiment, the thermal adaptation layer 276 is positioned above the thermal resistance layer 275. In an embodiment, the thermal adaptation layer 276 forms a top surface of the member 274. The liquid in the space 11 comes into direct contact with the thermal adaptation layer 276. Due to the low specific heat capacity of the thermal adaptation layer 276, the variation in temperature of the liquid in the space 11 is very low. The low specific heat capacity of the thermal adaptation layer 276 means that a relatively small amount of energy is transferred between the liquid in the space 11 and the thermal adaptation layer 276 before the thermal adaptation layer 276 is at the substantially same temperature as the liquid in the space 11. Due to the relatively small amount of energy transfer, the variation in temperature of the liquid in the space 11 is relatively low.

In an embodiment, the thermal adaptation material has a higher thermal conductivity than the thermal conductivity of the table material. For heat transfer between the thermal adaptation layer 276 and the liquid in the space 11, there may be a high transfer coefficient. When the liquid comes into contact with the thermal adaptation layer 276, the member 274 adapts its temperature to the temperature of the liquid quickly, partly due to the high transfer coefficient.

In an embodiment, the thermal adaptation layer 276 has a thickness of less than or equal to 50 micrometers, of less than or equal to 20 micrometers, or of less than or equal to 10 micrometers. The thermal adaptation layer 276 is thin such that it has a low overall heat capacity and does not significantly affect the coplanar relationship between the top surface 122 of the substrate table WT and the substrate W, for example. When the liquid in the space 11 comes into contact with the thermal adaptation layer 276, the variation in temperature of the liquid due to heat transfer between the member 274 and the liquid is relatively low.

In an embodiment, the thermal adaptation material has a specific heat capacity at 25° C. of less than or equal to 800 J/kgK or a specific heat capacity at 25° C. of less than or equal to 600 J/kgK. By having a low specific heat capacity, the temperature variation in the liquid when the liquid comes into contact with the member 274 is relatively low.

In an embodiment, the thermal adaptation material is selected from a group consisting of stainless steel and titanium. In an embodiment, a material that may be used for the thermal adaptation material comprises aluminum, SiSiC, (Encapsulated) Thermal Pyrolytic Graphite and lithium aluminosilicate glass-ceramic (such as Zerodur®). These materials may be less favorable than stainless steel and titanium because they have a higher specific heat capacity. In an embodiment, the thermal adaptation material is water-resistant. In an embodiment, the thermal adaptation material has relatively high thermal resistance.

Stainless steel has a thermal conductivity of about 16 to 24 W/mK. Titanium has a thermal conductivity of about 15 to 23 W/mK. The thermal conductivity of the thermal adaptation material may be greater than the thermal conductivity of the table material. In an embodiment, the thermal conductivity of the thermal adaptation material is relatively low. For example, stainless steel and titanium have relatively low thermal conductivities compared to other metals that would be water-resistant and have a low specific heat capacity.

In an embodiment, the thermal resistance layer 275 is between the thermal adaptation layer 276 and both the top surface 122 of the substrate table WT and the top surface 277 of the body 271. The liquid comes into contact with the thermal adaptation layer 276 but not the thermal resistance layer 275.

In an embodiment, the thermal resistance material has a higher specific heat capacity at 25° C. than a heat capacity of the table material.

In an embodiment, the thermal resistance layer 275 has a thickness of less than or equal to 50 micrometers, of less than or equal to 20 micrometers, or of less than or equal to 10 micrometers. The thermal resistance layer 275 is thin so that the overall heat capacity of the member 274 is relatively low. When the member 274 comes into contact with the liquid, the variation in temperature of the liquid is relatively low due to the low heat capacity of the member 274.

In an embodiment, the thermal resistance material has a thermal conductivity of less than or equal to 0.5 W/mK, of less than or equal to 0.1 W/mK, or of less than or equal to 0.05 W/mK. By having a relatively low thermal conductivity and accordingly a high thermal resistance, the member 274, and in particular the thermal resistance layer 275, reduces the thermal transfer between the table material of the substrate table WT and the liquid in the space 11 when the liquid confinement structure IH is directly above the substrate table WT.

In an embodiment, the thermal resistance material is an adhesive. The thermal resistance layer 275 may act to adhere the thermal adaptation layer 276 to the substrate table WT and to the body 271. In an embodiment, the member 274 is a sticker.

In an embodiment, the thermal resistance material is selected from a group consisting of an acrylate polymer, a silyl terminated polyether (such as MS Polymer®) and epoxy. In an embodiment, another material may be used as the thermal resistance material. Epoxy may have a thermal conductivity within the range of from about 0.05 W/mK to about 0.35 W/mK. Epoxy has a specific heat capacity at 25° C. of about 1000 J/kgK.

In an embodiment, the table material may be cordierite or Zerodur®. Zerodur® has a specific heat capacity at 25° C. of about 820 J/kgK. Zerodur® has a thermal conductivity of about 1.5 W/mK.

In an embodiment, the member 274 has a total thickness of less than or equal to 100 micrometers, of less than or equal to 50 micrometers, of less than or equal to 20 micrometers, or of less than or equal to 10 micrometers. The member 274 has a small total thickness such that its total heat capacity is relatively low. This reduces the temperature variation in the liquid that comes into contact with the member 274. In an embodiment, the member 274 is thin such that it does not significantly adversely affect the flat top surface 122 of the substrate table WT.

In an embodiment, the member 274 has a mean thermal conductivity of less than or equal to 25 W/mK, of less than or equal to 15 W/mK or of less than or equal to 10 W/mK. Mean thermal conductivity refers to the thermal conductivity of the member 274 as a whole, rather than a sub-portion of it. The member 274 has a low mean thermal conductivity so as to reduce heat transfer between the table material of the substrate table WT and the liquid in the space 11 when the liquid confinement structure IH is directly above the substrate table WT.

In an embodiment, the member 274 has a mean specific heat capacity at 25° C. of less than or equal to 1500 J/kgK, at 25° C. of less than or equal to 1000 J/kgK, or at 25° C. of less than or equal to 750 J/kgK. Mean specific heat capacity at 25° C. refers to the specific heat capacity at 25° C. of the member 274 as a whole, rather than a sub-portion of it. The member 274 has a low mean specific heat capacity such that the member 274 adapts its temperature relatively quickly to the temperature of the liquid that comes into contact with the member 274.

Figure 29:
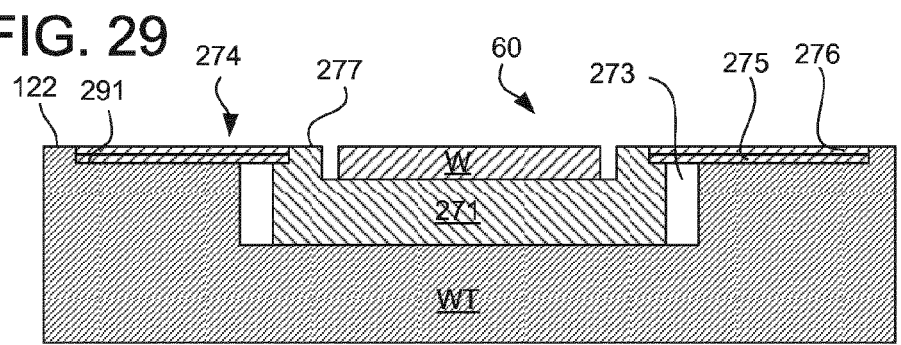

FIG. 29 depicts, in cross-section, a support apparatus 60 according to an embodiment of the invention. As depicted in FIG. 29, in an embodiment, the substrate table WT comprises a member recess 291. The member 274 is at least partially within the member recess 291. The member recess 291 reduces the extent by which the member 274 is above (if at all) the top surface 122 of the substrate table WT. In an embodiment, the member recess 291 has a depth that is substantially equal to the total thickness of the member 274. In an embodiment, the member 274 is substantially coplanar with the top surface 122 of the substrate table WT. In an embodiment, the top surface of the member 274 is substantially coplanar with the substrate W in the case that the substrate is held by a substrate holder 61 in the substrate table WT.

Figure 30:
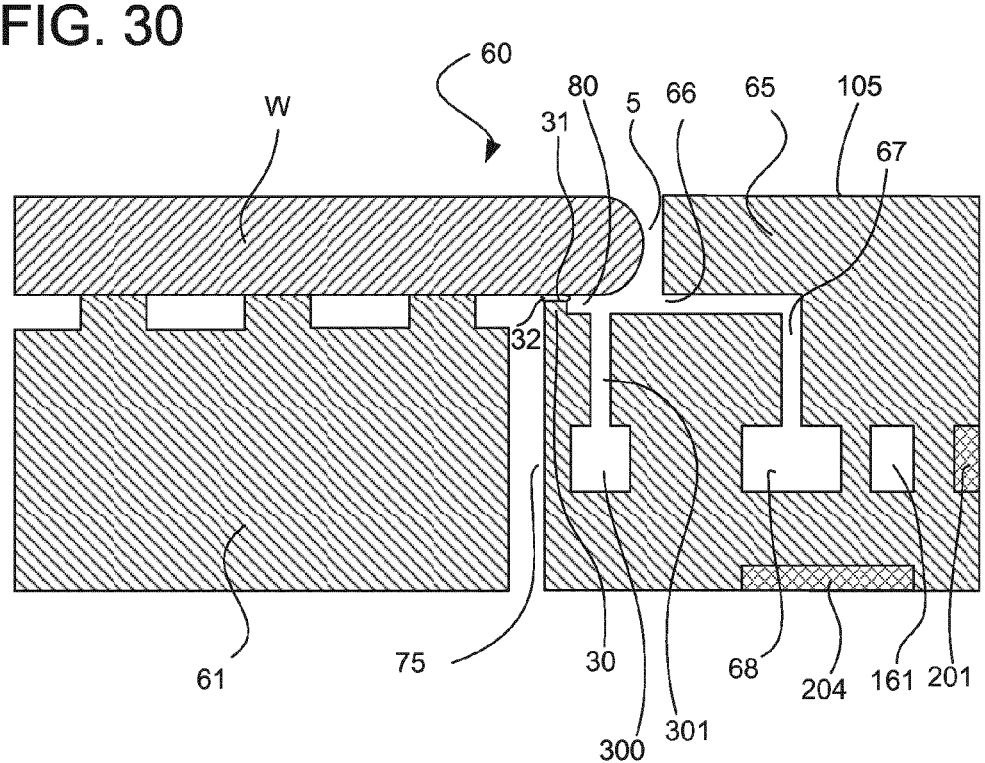

FIG. 30 depicts, in cross-section, a part of a support apparatus of an embodiment. The extraction body 65 is substantially thermally decoupled and/or substantially mechanically decoupled from the substrate holder 61.

In an embodiment, the extraction body 65 comprises a projection 30. The projection 30 is configured such that it surrounds the object holder (e.g. substrate holder 61). The projection 30 is configured such that, in use, a layer of liquid 32 is retained on the projection 30 and in contact with an object (e.g. substrate W) supported on the object holder (e.g. substrate holder 61).

In an embodiment, the projection 30 may be configured such that its top surface 31 forms an annulus. The annulus extends around the inner region of the extraction body 65. The annulus surrounds the substrate holder 61. This may facilitate manufacture. In an embodiment the projection 30 extends in the direction substantially normal to the substrate W. In an embodiment the top surface 31 of the projection 30 faces a lower surface of the substrate W.

In an embodiment, the projection 30 may be configured such that the separation between the top surface 31 of the projection 30 and the lower surface of a substrate W supported by the substrate holder 61 is about 20 µm or less. In an embodiment, the projection may be configured such that the separation between the top surface 31 of the projection 30 and the lower surface of a substrate W supported by the substrate holder 61 is 10 μm or less.

In use, a layer of liquid 32 is retained on the projection 30, between the top surface 31 of the projection 30 and the lower surface of the substrate W. The projection 30 is configured such that, in use, the layer of liquid 32 prevents liquid from flowing from radially outward of the projection 30 to radially inward of the projection 30. This may be achieved because the capillary pressure of the layer of liquid 32 retained on the projection 30 is greater than the force due to the pressure difference between radially outward of the projection 30 and radially inward of the projection 30. The capillary pressure is the force necessary to force the layer of liquid 32 through the gap between the substrate W and the projection 30 and is higher for smaller gaps. The capillary pressure is caused by the difference in pressure across the interface between the layer of liquid 32 and the surrounding gas (e.g. air).

If the separation between the top surface 31 of the projection 30 and the lower surface of the substrate W is too great (e.g. greater than 20 μm, or greater than 10 μm), then the capillary pressure of the layer of liquid 32 is not great enough to prevent liquid from flowing from radially outward of the projection 30 to radially inward of the projection 30. The smaller the separation, the greater the capillary pressure, and thereby the greater the function of preventing liquid from flowing from radially outward of the projection 30 to radially inward of the projection 30.

The top surface 31 of the projection 30 does not come into contact with the lower surface of the substrate W. Any such contact would be undesirable because it would adversely affect the flatness of the substrate W. For this reason, it may be desirable to provide a lower limit for the target separation between the top surface 31 of the projection 30 and the lower surface of the substrate W. For example, in an embodiment the projection 30 is configured such that the separation between the top surface 31 of the projection 30 and the lower surface of the substrate W is 2 μm or more.

In an embodiment, the top surface 31 of the projection 30 is lower than the top surface 105 of the extraction body 65. This allows the substrate W to be positioned such that a peripheral region of the substrate W is positioned directly above the projection 30. The top surface of the substrate W may be substantially coplanar with the top surface 105 of the extraction body 65.

In an embodiment, the substrate support apparatus 60 is configured such that, in use, part of the extraction body 65 extends under a peripheral edge of an object (e.g. a substrate W) supported on the object holder (e.g. a substrate holder 61). This is depicted in FIG. 30, which shows that the inner peripheral region of the extraction body 65 overlaps with the outer peripheral region of the substrate W in the radial direction. Liquid that flows from above the substrate W and/or above the extraction body 65 may flow through the gap 5 between the extraction body 65 and the substrate W. Liquid that flows through the gap 5 may be extracted via the extraction opening 66, passageway 67 and channel 68 of the extraction body 65. By providing that the extraction body 65 reaches out to below the substrate W, such liquid is prevented from reaching the substrate holder 61.

In an embodiment, as shown in FIG. 30, the substrate holder 61 comprises substantially no liquid extractor of any kind. In an embodiment the substrate holder 61, in use, comes into contact with substantially no liquid used in the immersion lithographic apparatus. Liquid is extracted by only the extraction body 65, which is separated from the substrate holder 61. The substrate W is supported by only the substrate holder 61 and not by the extraction body 65. In an embodiment, there is a complete separation between the substrate supporting function (performed by the substrate holder 61) and the liquid capturing function (performed by the extraction body 65). In an embodiment, the substrate holder 61 is a separate body from the extraction body 65. The thermal load caused by the layer of liquid 32 on the projection 30 is minimal.

The substrate holder 61 performs a function of supporting the substrate W and performing accurate positioning. By arranging the substrate support apparatus 60 such that the substrate holder 61 comes into contact with substantially no liquid, the accuracy with which the substrate holder 61 positions the substrate W can be increased. This is because the substrate holder 61 is substantially unaffected by thermal loads caused by evaporation of liquid, for example.

By providing the projection 30, the possibility of liquid coming into contact with the substrate holder 61 is avoided, thereby increasing the accuracy of the substrate holder 61.

In an embodiment, the extent of overlap between the inner peripheral region of the extraction body 65 and the outer peripheral region of the substrate W is about 0.5 mm or more. In an embodiment, the extent of overlap between the inner peripheral region of the extraction body 65 and the outer peripheral region of the substrate W is about 3 mm or less.

In an embodiment, the extraction body 65 may comprise a channel 300. The channel 300 is connected to a passageway 301 that connects the channel 300 to the passageway 80 of the extraction body 65. The channel 300 and the passageway 301 are optional. The passageway 80 is positioned between the lower surface of the substrate W and an upper surface of the extraction body 65. The passageway 80 is positioned immediately radially outward of the projection 30. The passageway 80 extends below the substrate W.

In an embodiment, the channel 300 is in communication with a vacuum such that fluid is sucked from the passageway 80 through the passageway 301 into the channel 300. In an embodiment, the channel 300 is in communication with an over-pressure and the passageway 301 connects the channel 300 to the intermediate gap 75. In an embodiment the vacuum or overpressure is controlled so as to force the layer of liquid 32 radially outward and off the projection 30. This may be done before unloading the substrate W, for example. This makes it easier to remove the substrate W and makes it possible to export dry substrates.

In an embodiment the channel 300 is used to control the difference between the pressure radially outward of the projection 30 and the pressure radially inward of the projection 30 such that the pressure difference is less than the capillary pressure of the layer of liquid 32. This keeps the layer of liquid 32 on the projection 30.

In an embodiment, the passageway 301 does not connect the channel 300 to the passageway 80 of the extraction body 65. Instead, in an embodiment the passageway 301 connects the channel 300 to the intermediate gap 75 between the extraction body 65 and the substrate holder 61. In this case the channel is in communication with an overpressure. In an embodiment the passageway 301 connects the passageway 80 to the channel 68, in which case the channel 300 may be omitted.

There is a possibility that the capillary pressure of the layer of fluid 32 on the projection 30 causes the outer periphery of the substrate W to be pulled downward. There is a risk that this reduces the flatness of the substrate W. The flatness may be reduced by an amount in the region of about 10 nm. The effect of the capillary pressure on the flatness of the substrate W can be predicted and compensated for.

There is a possibility of bubbles congregating in the passageway 80 close to the projection 30. This is because in the region immediately radially outward of the projection 30, the flow of fluid is at a particularly low rate in both directions. In an embodiment, the channel 300 and the passageway 301 may be used to suck any such bubbles or gas pockets from this corner of the passageway 80 of the extraction body 65.

In an embodiment, the extraction body 65 comprises thermal conditioning system such as a network of fluid-carrying channels 161 configured to control the temperature of the extraction body 65. In an embodiment the fluid-carrying channels 161 carry thermal conditioning liquid. The thermal conditioning liquid may be water, for example. The fluid-carrying channels 161 maintain the temperature of the extraction body 65 at a certain (e.g. predetermined) temperature. In an embodiment, one or more heater/temperature sensors (not shown) may be positioned in or near the fluid-carrying channels 161 so as to control the temperature of the thermal conditioning liquid within the fluid-carrying channels 161.

For a substrate support apparatus in which the substrate holder and the extraction body are formed as part of the same body (i.e. such that there is no intermediate gap 75), by providing such fluid-carrying channels, the maximum substrate displacement due to a thermal load caused by extraction may be reduced by a factor of about two. Alternatively, by thermally decoupling the extraction body from the substrate holder (i.e. by providing the intermediate gap 75), the maximum substrate displacement due to a thermal load caused by extraction may be reduced by a factor of about six. Hence, thermal decoupling of the extraction body from the substrate holder is about three times more effective in reducing substrate displacement compared to providing the fluid-carrying channels.

The combined effect of the thermal decoupling together with the fluid-carrying channels (or alternative temperature control mechanisms such as edge heaters) is greater than the sum of the individual effects. In particular, it has been found that by providing the intermediate gap 75 in combination with the fluid-carrying channels 161 (e.g. as depicted in FIG. 30), the maximum substrate displacement due to extraction is reduced by a factor of about 80 (which is significantly greater than 2×6=12). The reason for this is explained below.

Although the thermal decoupling by providing the intermediate gap 75 reduces the maximum substrate displacements by a factor of about six, the temperature difference across the substrate support apparatus 60 is increased by a factor of about 10, which is undesirable. Providing the fluid-carrying channels 161 in the extraction body 65 is effective in reducing the temperature difference across the substrate support apparatus 60. Accordingly, by providing the intermediate gap 75 and the fluid-carrying channels 161, the maximum substrate displacement is decreased by such a great factor. In an embodiment, the intermediate gap is at least 0.2 mm. In an embodiment, the intermediate gap is at least 0.5 mm. In an embodiment, the intermediate gap is at most 3 mm.

In an embodiment, the extraction body 65 comprises an edge heater 201 on an outer edge of the extraction body 65. In an embodiment, the extraction body 65 comprises an edge heater 204 on a lower surface of the extraction body 65. In an embodiment, the edge heaters 201, 204 are independently controllable by the controller 500. The edge heaters 201, 204 help maintain stability of the temperature profile of the substrate support apparatus 60. Each of the edge heaters 201, 204 may comprise a temperature sensor. The edge heaters 201, 204 may be used in addition to, or as an alternative to, the fluid carrying channel 161.

The features depicted in the Figures may be combined with each other. Merely by way of example, the features of FIG. 30 may be combined with the interface 81 of FIG. 8 and/or the cover ring 112 of FIG. 11.

In an embodiment there is provided a support apparatus comprising: a table formed of a table material having a thermal conductivity; a body positioned within a recess of the table, wherein there is a gap between the body and the table; and a member bridging the gap from a top surface of the body to a top surface of the table, the member comprising a thermal resistance layer of thermal resistance material having a lower thermal conductivity than the thermal conductivity of the table material.

In an embodiment, more of the member is on the top surface of the table than on the top surface of the body.

In an embodiment, the member extends further outwards along the top surface of the table than inwards along the top surface of the body.

In an embodiment, the member extends over substantially the entire top surface of the table.

In an embodiment, the member comprises a thermal adaptation layer of thermal adaptation material having a lower specific heat capacity at 25° C. than a specific heat capacity at 25° C. of the table material.

In an embodiment, the thermal adaptation material has a higher thermal conductivity than the thermal conductivity of the table material.

In an embodiment, the thermal resistance layer is between the thermal adaptation layer and both the top surface of the table and the top surface of the body.

In an embodiment, the thermal resistance material has a higher specific heat capacity at 25° C. than a specific heat capacity of the table material.

In an embodiment, the thermal resistance material is an adhesive.

In an embodiment, the support apparatus further comprises an object holder configured to support an object and wherein the body is an extraction body radially outward of the object holder, the extraction body comprising an extraction opening configured to extract fluid from a top surface of the support apparatus, wherein the extraction body is spaced from the object holder such that the extraction body is substantially decoupled from the object holder; wherein the extraction body comprises a projection configured such that it surrounds the object holder and such that, in use, a layer of fluid is retained on the projection and in contact with an object supported on the object holder.

In an embodiment, the extraction body is disconnected from the object holder such that the extraction body is detached from the object holder.

In an embodiment, the projection is configured such that, in use, the layer of liquid prevents liquid from flowing from radially outward of the projection to radially inward of the projection.

In an embodiment, the extraction body is spaced from the object holder by an intermediate gap that comprises a vacuum or a gas.

In an embodiment, the object holder and at least part of the extraction body are positioned within an object holder recess of the table, and wherein the extraction body is connected to the table at an interface.

In an embodiment, the interface is at a bottom surface and/or a radial surface of the extraction body.

In an embodiment, the extraction body is connected to the table by a vacuum clamp, a bolt, glue and/or a kinematic leaf spring coupling.

In an embodiment, the support apparatus further comprises an object holder, wherein the body is an extraction body radially outward of the object holder, the extraction body comprising an extraction opening configured to extract fluid from a top surface of the support apparatus, wherein the extraction body is connected to the object holder by a plurality of peripherally spaced joints such that, between the joints, the extraction body is spaced from the object holder.

In an embodiment, at least one of the joints extends from a top surface of the object holder only partially toward a bottom surface of the extraction body such that directly below the at least one joint the extraction body is spaced from the object holder.

In an embodiment, at least one of the joints comprises a joint conditioning system configured to supply heat energy to and/or remove heat energy from the joint and/or between the joints.

In an embodiment, the joints, in total, extend along at most 10% of a periphery between the object holder and the extraction body.

In an embodiment, the object holder and at least part of the extraction body are positioned within an object holder recess of the table.

In an embodiment, the extraction body comprises a projection configured such that it surrounds the object holder and such that, in use, a layer of liquid is retained on the projection and in contact with an object supported on the object holder.

In an embodiment, the projection is configured such that, in use, the layer of liquid prevents liquid from flowing from radially outward of the projection to radially inward of the projection.

In an embodiment, a top surface of the projection is lower than a top surface of the extraction body.

In an embodiment, the support apparatus is configured such that, in use, part of the extraction body extends under a peripheral edge of an object supported on the object holder.

In an embodiment, the extraction body comprises a main body and a cover ring positioned at a top surface of the main body, wherein the member is on top of the cover ring.

In an embodiment, the cover ring extends radially outward beyond a radial extent of the main body.

In an embodiment, the cover ring extends substantially to a fiduciary marker at the top surface of the table of the support apparatus.

In an embodiment, the extraction body comprises an extraction body conditioning system configured to supply heat energy to and/or remove heat energy from the extraction body.

In an embodiment, the extraction body conditioning system comprises a plurality of conditioning units that are independently controllable, wherein each of the plurality of conditioning units is configured to supply heat energy to and/or remove heat energy from a respective conditioning region of the extraction body.

In an embodiment, the extraction body conditioning system comprises a network of fluid-carrying channels configured to control the temperature of the extraction body.

In an embodiment, the extraction body conditioning system comprises a cooling channel containing carbon dioxide at a pressure such that the carbon dioxide has a boiling point of at most 30° C. or at most 22° C.

In an embodiment, the extraction body conditioning system comprises a heat pipe.

In an embodiment, the support apparatus of any of claims comprises a liquid extractor radially inward of the extraction opening and configured to extract liquid from a top surface of the object holder.

In an embodiment, the extraction body comprises at least part of the liquid extractor.

In an embodiment, the liquid extractor comprises a liquid extractor conditioning system configured to supply heat energy to and/or remove heat energy from the liquid extractor.

In an embodiment, the extraction body comprises an extraction body conditioning system configured to supply heat energy to and/or remove heat energy from the extraction body, and wherein the liquid extractor conditioning system and the extraction body conditioning system are independently controllable.

In an embodiment, the liquid extractor conditioning system comprises a network of fluid-carrying channels configured to control the temperature of the liquid extractor.

In an embodiment, a space between the extraction body and the object holder is continuous peripherally and continuous from an upper surface of the extraction body to a bottom surface of the extraction body.

In an embodiment, the object holder is a substrate holder.

In an embodiment, there is provided a device manufacturing method using a lithographic apparatus, the method comprising: projecting a beam patterned by a patterning device onto a substrate while supporting the substrate with a support apparatus, wherein the support apparatus comprises: a table formed of a table material having a thermal conductivity; a body positioned within a recess of the table, wherein there is a gap between the body and the table; and a member bridging the gap from a top surface of the body to a top surface of the table, the member comprising a thermal resistance layer of thermal resistance material having a lower thermal conductivity than the thermal conductivity of the table material.

In an embodiment, there is provided a support apparatus for a lithographic apparatus, comprising: an object holder configured to support an object; and an extraction body radially outward of the object holder, the extraction body comprising an extraction opening configured to extract fluid from a top surface of the support apparatus, wherein the extraction body is spaced from the object holder such that the extraction body is substantially decoupled from the object holder, wherein the extraction body comprises a projection configured such that it surrounds the object holder and such that, in use, a layer of liquid is retained on the projection and in contact with an object supported on the object holder.

In an embodiment, the support apparatus is configured such that, in use, a capillary pressure of the layer of liquid is greater than a pressure difference between radially outward of the projection and radially inward of the projection, thereby preventing the fluid from flowing from radially outward of the projection to radially inward of the projection. In an embodiment, the extraction body is spaced from the object holder by an intermediate gap that comprises a vacuum or a gas. In an embodiment, the support apparatus is configured such that, in use, part of the extraction body extends under a peripheral edge of an object supported on the object holder.

In an embodiment, there is provided a support apparatus for a lithographic apparatus, comprising: an object holder; and an extraction body radially outward of the object holder, the extraction body comprising an extraction opening configured to extract fluid from a top surface of the support apparatus, wherein the extraction body is connected to the object holder by a plurality of peripherally spaced joints such that, between the joints, the extraction body is spaced from the object holder.

In an embodiment, at least one of the joints extends from a top surface of the object holder only partially toward a bottom surface of the extraction body such that directly below the at least one joint the extraction body is spaced from the object holder. In an embodiment, at least one of the joints comprises a joint conditioning system configured to supply heat energy to and/or remove heat energy from the joint and/or between the joints. In an embodiment, the joints, in total, extend along at most 10% of a periphery between the object holder and the extraction body, wherein the joints are substantially evenly distributed along the whole circumference of the periphery. In an embodiment, the extraction body comprises a main body and a cover ring positioned at a top surface of the main body. In an embodiment, the cover ring extends radially outward beyond a radial extent of the main body. In an embodiment, the extraction body comprises an extraction body conditioning system configured to supply heat energy to and/or remove heat energy from the extraction body. In an embodiment, the extraction body conditioning system comprises a plurality of conditioning units that are independently controllable, wherein each of the plurality of conditioning units is configured to supply heat energy to and/or remove heat energy from a respective conditioning region of the extraction body. In an embodiment, the extraction body conditioning system comprises a network of fluid-carrying channels configured to control the temperature of the extraction body. In an embodiment, the extraction body conditioning system comprises a cooling channel containing carbon dioxide at a pressure such that the carbon dioxide has a boiling point of at most 30° C. or at most 22° C. In an embodiment, the support apparatus comprises a liquid extractor radially inward of the extraction opening and configured to extract liquid from a top surface of the object holder. In an embodiment, the extraction body comprises at least part of the liquid extractor. In an embodiment, the liquid extractor comprises a liquid extractor conditioning system configured to supply heat energy to and/or remove heat energy from the liquid extractor. In an embodiment, the extraction body comprises an extraction body conditioning system configured to supply heat energy to and/or remove heat energy from the extraction body, and wherein the liquid extractor conditioning system and the extraction body conditioning system are independently controllable. In an embodiment, the liquid extractor conditioning system comprises a network of fluid-carrying channels configured to control the temperature of the liquid extractor. In an embodiment, the object holder is a substrate holder. In an embodiment, the support apparatus comprises a table formed of a table material having a thermal conductivity, the extraction body positioned within a recess of the table and there is a gap between the extraction body and the table; and a member bridging the gap from a top surface of the extraction body to a top surface of the table, the member comprising a thermal resistance layer of thermal resistance material having a lower thermal conductivity than the thermal conductivity of the table material. In an embodiment, more of the member is on the top surface of the table than on the top surface of the extraction body. In an embodiment, the member extends further outwards along the top surface of the table than inwards along the top surface of the extraction body. In an embodiment, the member extends over substantially the entire top surface of the table. In an embodiment, the member comprises a thermal adaptation layer of thermal adaptation material, the thermal adaptation material having a lower specific heat capacity at 25° C. than a specific heat capacity at 25° C. of the table material. In an embodiment, the thermal adaptation material has a higher thermal conductivity than the thermal conductivity of the table material. In an embodiment, the thermal resistance layer is between the thermal adaptation layer and both the top surface of the table and the top surface of the extraction body. In an embodiment, the thermal resistance material has a higher specific heat capacity at 25° C. than a specific heat capacity of the table material.

In an embodiment, there is provided a lithographic apparatus comprising a support apparatus as described herein.

In an embodiment, there is provided a device manufacturing method using a lithographic apparatus, the method comprising: projecting a beam patterned by a patterning device onto a substrate while supporting the substrate with a support apparatus, wherein the support apparatus comprises: an object holder configured to support an object; and an extraction body radially outward of the object holder, the extraction body comprising an extraction opening configured to extract fluid from a top surface of the support apparatus, wherein the extraction body is spaced from the object holder such that the extraction body is substantially decoupled from the object holder, wherein the extraction body comprises a projection configured such that it forms an annulus that surrounds the object holder and such that, in use, a layer of fluid is retained on the projection and in contact with an object supported on the object holder.

In an embodiment, there is provided a device manufacturing method using a lithographic apparatus, the method comprising: projecting a beam patterned by a patterning device onto a substrate while supporting the substrate with a support apparatus, wherein the support apparatus comprises: an object holder; and an extraction body radially outward of the object holder, the extraction body comprising an extraction opening configured to extract fluid from a top surface of the support apparatus, wherein the extraction body is connected to the object holder by a plurality of peripherally spaced joints such that, between the joints, the extraction body is spaced from the object holder.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, flat-panel displays, liquid-crystal displays (LCDs), thin film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist), a metrology tool and/or an inspection tool. Where applicable, the disclosure herein may be applied to such and other substrate processing tools. Further, the substrate may be processed more than once, for example in order to create a multi-layer IC, so that the term substrate used herein may also refer to a substrate that already contains one or multiple processed layers.

The terms "radiation" and "beam" used herein encompass all types of electromagnetic radiation, including ultraviolet (UV) radiation (e.g. having a wavelength of or about 436, 405, 365, 248, 193, 157 or 126 nm). The term "lens", where the context allows, may refer to any one or combination of various types of optical components, including refractive and reflective optical components.

While specific embodiments of the invention have been described above, it will be appreciated that the invention may be practiced otherwise than as described. For example, the embodiments of the invention may take the form of a computer program containing one or more sequences of machine-readable instructions describing a method as disclosed above, or a data storage medium (e.g. semiconductor memory, magnetic or optical disk) having such a computer program stored therein. Further, the machine readable instruction may be embodied in two or more computer programs. The two or more computer programs may be stored on one or more different memories and/or data storage media.

Any controllers described herein may each or in combination be operable when the one or more computer programs are read by one or more computer processors located within at least one component of the lithographic apparatus. The controllers may each or in combination have any suitable configuration for receiving, processing, and sending signals. One or more processors are configured to communicate with the at least one of the controllers. For example, each controller may include one or more processors for executing the computer programs that include machine-readable instructions for the methods described above. The controllers may include data storage media for storing such computer programs, and/or hardware to receive such media. So the controller(s) may operate according the machine readable instructions of one or more computer programs.

One or more embodiments of the invention may be applied to any immersion lithography apparatus, in particular, but not exclusively, those types mentioned above and whether the immersion liquid is provided in the form of a bath, only on a localized surface area of the substrate, or is unconfined. In an unconfined arrangement, the immersion liquid may flow over the surface of the substrate and/or substrate table so that substantially the entire uncovered surface of the substrate table and/or substrate is wetted. In such an unconfined immersion system, the liquid supply system may not confine the immersion liquid or it may provide a proportion of immersion liquid confinement, but not substantially complete confinement of the immersion liquid.

A liquid supply system as contemplated herein should be broadly construed. In certain embodiments, it may be a mechanism or combination of structures that provides a liquid to a space between the projection system and the substrate and/or substrate table. It may comprise a combination of one or more structures, one or more fluid openings including one or more liquid openings, one or more gas openings or one or more openings for two phase flow. The openings may each be an inlet into the immersion space (or an outlet from a fluid handling structure) or an outlet out of the immersion space (or an inlet into the fluid handling structure). In an embodiment, a surface of the space may be a portion of the substrate and/or substrate table, or a surface of the space may completely cover a surface of the substrate and/or substrate table, or the space may envelop the substrate and/or substrate table. The liquid supply system may optionally further include one or more elements to control the position, quantity, quality, shape, flow rate or any other features of the liquid.

The descriptions above are intended to be illustrative, not limiting. Thus, it will be apparent to one skilled in the art that modifications may be made to the invention as described without departing from the scope of the claims set out below.

The invention claimed is:

1. A support apparatus for a lithographic apparatus, comprising:
   an object holder configured to support an object; and
   an extraction body radially outward of the object holder, the extraction body comprising an extraction opening configured to extract fluid from a top surface of the support apparatus, wherein the extraction body is spaced from the object holder such that the extraction body is effectively thermally and/or mechanically decoupled from the object holder, and wherein the extraction body comprises a projection configured such that the projection surrounds the object holder and such that, in use, a layer of liquid is retained on the projection and in contact with an object supported on the object holder.

2. The support apparatus of claim 1, configured such that, in use, a capillary pressure of the layer of liquid is greater than a pressure difference between radially outward of the projection and radially inward of the projection, thereby preventing the fluid from flowing from radially outward of the projection to radially inward of the projection.

3. The support apparatus of claim 1, wherein the extraction body is spaced from the object holder by an intermediate gap that comprises a vacuum or a gas.

4. The support apparatus of claim 1, configured such that, in use, part of the extraction body extends under a peripheral edge of an object supported on the object holder.

5. The support apparatus of claim 1, wherein the extraction body comprises a main body and a cover ring positioned at a top surface of the main body.

6. The support apparatus of claim 5, wherein the cover ring extends radially outward beyond a radial extent of the main body.

7. The support apparatus of claim 1, wherein the extraction body comprises an extraction body conditioning system configured to supply heat energy to and/or remove heat energy from the extraction body.

8. The support apparatus of claim 7, wherein the extraction body conditioning system comprises a cooling channel containing carbon dioxide at a pressure such that the carbon dioxide has a boiling point of at most 30° C. or at most 22° C.

9. The support apparatus of claim 1, comprising a liquid extractor radially inward of the extraction opening and configured to extract liquid from a top surface of the object holder.

10. The support apparatus of claim 9, wherein the extraction body comprises at least part of the liquid extractor.

11. A lithographic apparatus comprising a projection system configured to project a radiation beam onto a radiation-sensitive substrate and the support apparatus of claim 1.

12. A device manufacturing method using a lithographic apparatus, the method comprising:
   projecting a beam patterned by a patterning device onto a substrate while supporting the substrate with a support apparatus, wherein the support apparatus comprises:
   an object holder configured to support an object, and
   an extraction body radially outward of the object holder, the extraction body comprising an extraction opening configured to extract fluid from a top surface of the support apparatus, wherein the extraction body is spaced from the object holder such that the extraction body is effectively thermally and/or mechanically decoupled from the object holder and the extraction body comprises a projection configured such that it forms an annulus that surrounds the object holder; and retaining a layer of fluid on the projection and in contact with an object supported on the object holder during at least part of the projecting.

13. The method of claim 12, wherein a capillary pressure of the layer of liquid is greater than a pressure difference between radially outward of the projection and radially inward of the projection, thereby preventing the fluid from flowing from radially outward of the projection to radially inward of the projection.

14. The method of claim 12, wherein the extraction body is spaced from the object holder by an intermediate gap that comprises a vacuum or a gas.

15. The method of claim 12, wherein part of the extraction body extends under a peripheral edge of an object supported on the object holder.

16. The method of claim 12, further comprising supplying heat energy to and/or remove heat energy from the extraction body using an extraction body conditioning system.

17. A support apparatus comprising:
an object holder configured to support an object;
an extraction body comprising an extraction opening configured to extract fluid from a top surface of the support apparatus, the extraction body effectively thermally and/or mechanically decoupled from the object holder, and the extraction body comprising a projection configured such that the projection surrounds the object holder and such that, in use, a layer of liquid is retained on the projection and in contact with an object supported on the object holder;
a table formed of a table material having a thermal conductivity, the extraction body positioned within a recess of the table and there is a gap between the extraction body and the table; and
a member bridging the gap from a top surface of the extraction body to a top surface of the table, the member comprising a thermal resistance layer of thermal resistance material having a lower thermal conductivity than the thermal conductivity of the table material.

18. The support apparatus of claim 17, wherein more of the member is on the top surface of the table than on the top surface of the extraction body.

19. The support apparatus of claim 17, wherein the member comprises a thermal adaptation layer of thermal adaptation material, the thermal adaptation material having a lower specific heat capacity at 25° C. than a specific heat capacity at 25° C. of the table material.

20. The support apparatus of claim 17, wherein the thermal adaptation material has a higher thermal conductivity than the thermal conductivity of the table material and/or the thermal resistance layer is between the thermal adaptation layer and both the top surface of the table and the top surface of the extraction body and/or the thermal resistance material has a higher specific heat capacity at 25° C. than a specific heat capacity of the table material.

* * * * *